US012795950B2

(12) United States Patent

Wang et al.

(10) Patent No.: US 12,795,950 B2

(45) Date of Patent: Nov. 10, 2026

(54) STRUCTURE AND FORMATION METHOD OF PACKAGE WITH INTEGRATED CHIPS

(71) Applicant: Taiwan Semiconductor Manufacturing Company, Ltd., Hsinchu (TW)

(72) Inventors: Chuei-Tang Wang, Taichung City (TW); Tso-Jung Chang, Taoyuan City (TW); Wen-Shiang Liao, Miaoli County (TW); Jeng-Shien Hsieh, Kaohsiung (TW); Chih-Peng Lin, Hsinchu County (TW); Shih-Ping Lin, Taichung City (TW); Chieh-Yen Chen, Taipei City (TW); Chen-Hua Yu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 731 days.

(21) Appl. No.: 18/151,742

(22) Filed: Jan. 9, 2023

(65) Prior Publication Data

US 2024/0206193 A1 Jun. 20, 2024

Related U.S. Application Data

(60) Provisional application No. 63/433,659, filed on Dec. 19, 2022.

(51) Int. Cl.

*H10B 80/00* (2026.01)
*H10W 70/60* (2026.01)
*H10W 70/65* (2026.01)
*H10W 72/00* (2026.01)

(Continued)

(52) U.S. Cl.

CPC .......... *H10B 80/00* (2023.02); *H10W 70/611* (2026.01); *H10W 70/65* (2026.01); *H10W 72/851* (2026.01); *H10W 74/117* (2026.01); *H10W 90/724* (2026.01); *H10W 90/732* (2026.01)

(58) Field of Classification Search

None

See application file for complete search history.

(56) References Cited

U.S. PATENT DOCUMENTS 8,993,380 B2 3/2015 Hou et al.
9,281,254 B2 3/2016 Yu et al.
9,299,649 B2 3/2016 Chiu et al.

(Continued)

FOREIGN PATENT DOCUMENTS

TW 202226544 A 7/2022

*Primary Examiner* — Long Pham

(74) *Attorney, Agent, or Firm* — Birch, Stewart, Kolasch & Birch, LLP

(57) ABSTRACT

A package structure and a formation method are provided. The method includes bonding a first memory-containing chip structure to a second memory-containing chip structure through dielectric-to-dielectric bonding and metal-to-metal bonding. The method also includes bonding a logic control chip structure to the second memory-containing chip structure through dielectric-to-dielectric bonding and metal-to-metal bonding. The logic control chip structure is formed using a more advanced technology node than the second memory-containing chip structure.

20 Claims, 30 Drawing Sheets

(51) Int. Cl.
*H10W 74/10* (2026.01)
*H10W 90/00* (2026.01)

(56) References Cited

U.S. PATENT DOCUMENTS

| | | | | |
|---|---|---|---|---|
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 9,853,053 | B2 | 12/2017 | Lupino et al. | |
| 11,158,606 | B2 | 10/2021 | Gao et al. | |
| 11,251,157 | B2 | 2/2022 | Yang et al. | |
| 2015/0279431 | A1 | 10/2015 | Li et al. | |
| 2016/0307872 | A1 | 10/2016 | Chen et al. | |
| 2019/0123023 | A1 | 4/2019 | Teig et al. | |
| 2021/0242104 | A1 | 8/2021 | Mallik et al. | |
| 2021/0407980 | A1 | 12/2021 | Young et al. | |
| 2022/0037289 | A1 | 2/2022 | Kim | |
| 2022/0045016 | A1* | 2/2022 | Jeng | H01L 23/5386 |
| 2022/0068905 | A1 | 3/2022 | Huang et al. | |
| 2022/0108967 | A1* | 4/2022 | Jeng | H01L 23/3135 |
| 2022/0165937 | A1 | 5/2022 | Lille et al. | |
| 2022/0262953 | A1 | 8/2022 | Kozuma et al. | |

* cited by examiner

STRUCTURE AND FORMATION METHOD OF PACKAGE WITH INTEGRATED CHIPS

PRIORITY CLAIM AND CROSS-REFERENCE

This application claims the benefit of U.S. Provisional Application No. 63/433,659, filed on Dec. 19, 2022, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
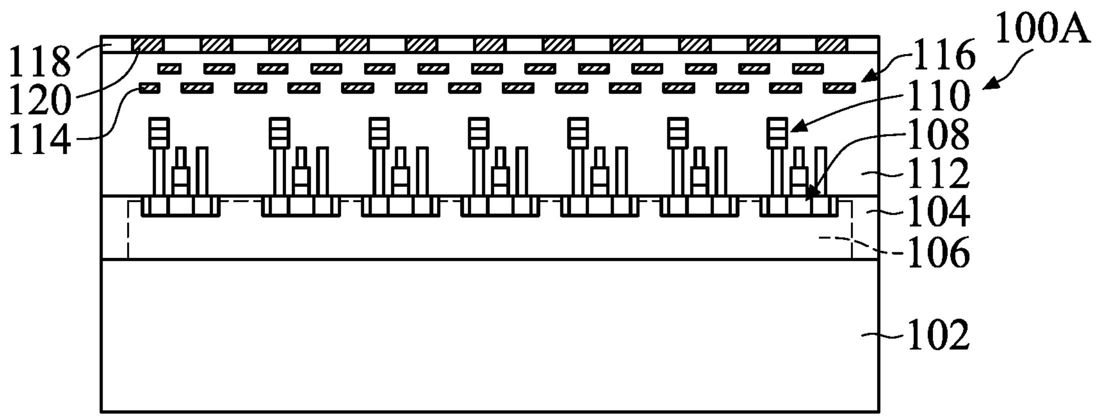
FIGS. 1A-1I are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging, 3D-IC devices, and 2.5D packaging. Embodiments of the disclosure form a package structure including a substrate that carries one or more dies or packages and a protective element (such as a protective lid) aside the dies or packages. The protective element may also function as a warpage-control element and/or heat dissipation element.

Other features and processes may also be included. For example, testing structures may be included to aid in the verification testing of the 3D packaging, 3DIC devices, and/or 2.5 D packaging. The testing structures may include, for example, test pads formed in a redistribution layer or on a substrate that allows testing to be conducted using probes or probe cards and the like. Verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1I are cross-sectional views of various stages of a process for forming a package structure, in accordance with some embodiments. As shown in FIG. 1A, a chip structure (or a chip-containing structure) 100A is disposed over a carrier substrate 102, in accordance with some embodiments. The carrier substrate 102 may be a carrier wafer. The carrier wafer may include a semiconductor wafer (such as a silicon wafer), a dielectric wafer (such as a glass wafer), or the like.

In some embodiments, the chip structure 100A is a semiconductor wafer. In some embodiments, the chip structure 100A is a memory-containing chip structure such as a semiconductor wafer that includes multiple memory elements. In some embodiments, the memory elements are non-volatile memory elements such as resistive random access memory (RRAM) elements, magnetoresistive random access memory (MRAM) elements, or the like.

As shown in FIG. 1A, the chip structure 100A includes a semiconductor substrate 104. In some embodiments, the semiconductor substrate 104 has a device region 106. Multiple device elements are formed in and/or on the device region 106. Examples of the various device elements include transistors (e.g., metal oxide semiconductor field effect transistors (MOSFET), complementary metal oxide semiconductor (CMOS) transistors, bipolar junction transistors (BJT), or other suitable elements. Various processes may be used to form the various device elements, including deposition, etching, implantation, photolithography, annealing, and/or other suitable processes.

In some embodiments, a front-side interconnection structure 116 is formed on the semiconductor substrate 104 for providing electrical connections to the device elements. The front-side interconnection structure 116 includes multiple conductive features 114 that are surrounded by multiple dielectric layers 112. The conductive features 114 may include conductive contacts, conductive lines, and conductive vias. The formation of the front-side interconnection structure 116 may involve multiple deposition processes, multiple patterning processes, and multiple planarization processes.

The device elements in the device region 106 of the chip structure 100A may be interconnected by the front-side interconnection structure 116 to form integrated circuit devices. In some embodiments, these device elements may form memory cell array elements, word line switch elements, level shifter elements, or the like.

In some embodiments, the chip structure 100A includes multiple transistors 108 and multiple resistive elements 110, as shown in FIG. 1A. The transistors 108 and the resistive elements 110 may together form a memory cell array such as a resistive random access memory (RRAM) cell array. Each of the resistive elements 110 may include a resistance variable layer that is sandwiched between a lower electrode and an upper electrode. The lower electrode of the resistive element 110 may be electrically connected to a drain feature of the respective transistor 108, as shown in FIG. 1A.

As shown in FIG. 1A, a dielectric layer 118 and multiple conductive features 120 are formed over the front-side interconnection structure 116, in accordance with some embodiments. The dielectric layer 118 and the conductive features 120 may function as bonding structures. Each of the conductive features 120 is electrically connected to a corresponding one of the conductive features 114 formed in the chip structure 100A.

The dielectric layer 118 may be made of or include silicon oxide, carbon-containing silicon oxide, silicon oxynitride, carbon-containing silicon oxynitride, one or more other suitable materials, or a combination thereof. The dielectric layer 118 may be deposited using a CVD process, an ALD process, one or more other applicable processes, or a combination thereof.

Afterwards, one or more photolithography processes and one or more etching processes are used to partially remove the dielectric layer 118. As a result, multiple openings that are used to contain conductive features are formed in the dielectric layer 118. One or more conductive materials are then deposited over the dielectric layer 118 to overfill these openings. A planarization process is then used to remove the portions of the conductive materials outside of the openings. As a result, the remaining portions of the conductive materials form the conductive features 120, as shown in FIG. 1A.

The conductive materials may be made of or include copper, aluminum, cobalt, tungsten, nickel, gold, platinum, one or more other suitable materials, or a combination thereof. The conductive materials may be deposited using a CVD process, an electroplating process, an electrochemical plating process, an ALD process, a PVD process, one or more other applicable processes, or a combination thereof. The planarization process may include a CMP process, a grinding process, a dry polishing process, an etching process, one or more other applicable processes, or a combination thereof. The planarization process may be used to provide a highly planarized bonding surface of the chip structure 100A.

Figure 1B:
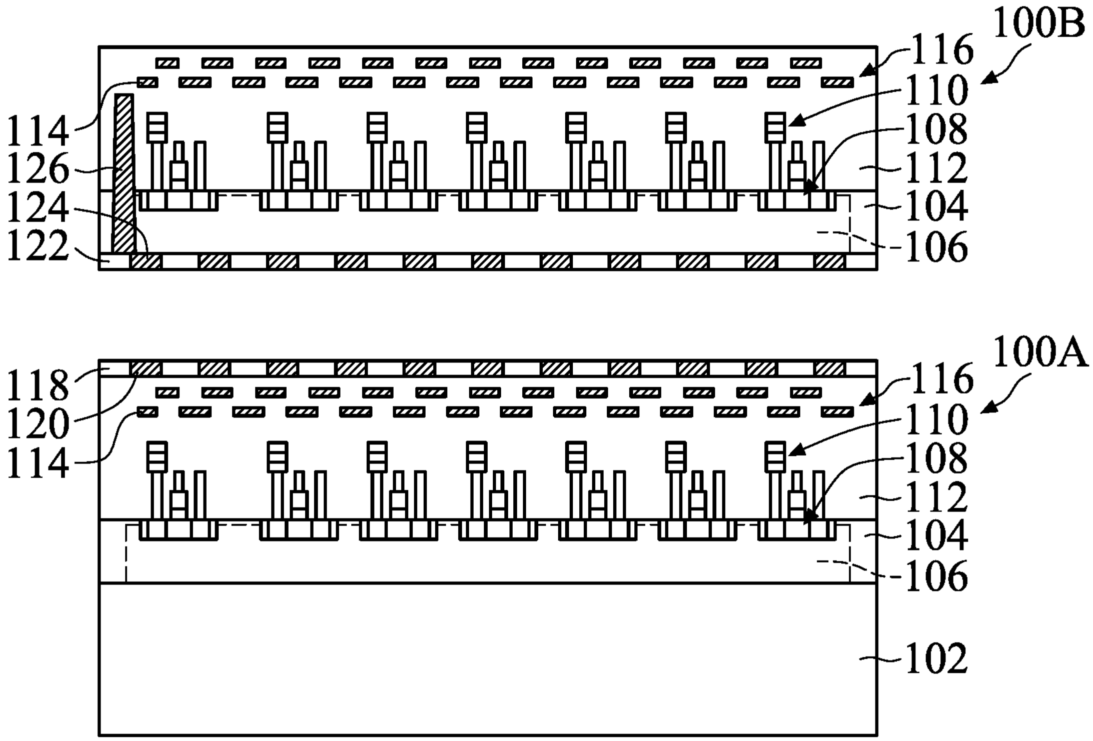

As shown in FIG. 1B, a chip structure 100B is provided to be bonded to the chip structure 100A, in accordance with some embodiments. In some embodiments, similar to the chip structure 100A, the chip structure 100B is a memory-containing chip structure such as a semiconductor wafer that includes multiple memory elements. In some embodiments, the memory elements are non-volatile memory elements such as resistive random access memory (RRAM) elements, magnetoresistive random access memory (MRAM) elements, or the like.

In some embodiments, multiple through substrate vias including a through substrate via 126 are formed in the chip structure 100B, as shown in FIG. 1B. In some embodiments, the through substrate via 126 extends from the backside of the chip structure 100B towards the front-side interconnection structure 116 of the chip structure 100B. In some embodiments, the chip structure 100A does not have a through substrate via.

In some embodiments, a dielectric layer 122 and multiple conductive features 124 are formed over the backside of the chip structure 100B, as shown in FIG. 1B. The material and formation method of the dielectric layer 122 may be the same as or similar to those of the dielectric layer 118. The material and formation method of the conductive features 124 may be the same as or similar to those of the conductive features 120. The dielectric layer 122 and the conductive features 124 may together function as a bonding structure. Similarly, a planarization process may be used to provide a highly planarized bonding surface of the chip structure 100B.

Figure 1C:
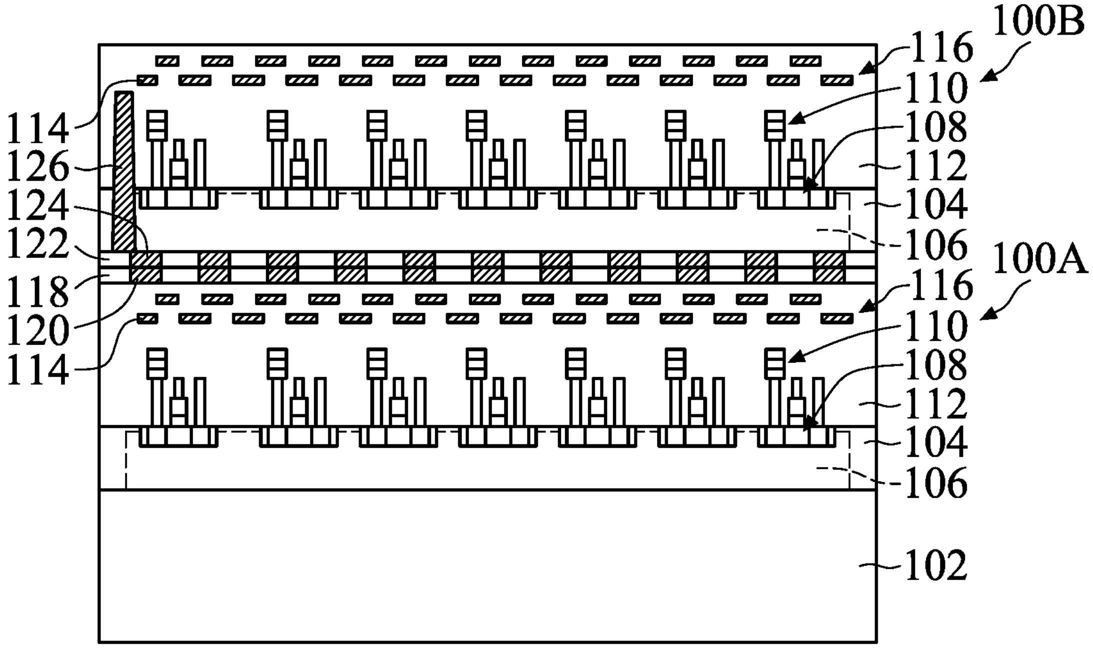

As shown in FIG. 1C, the chip structure 100B is bonded to the chip structure 100A through direct bonding, in accordance with some embodiments. The direct bonding may be achieved using a hybrid bonding, a fusion bonding, or the like. The hybrid bonding may include metal-to-metal bonding such as the bonding between the conductive features 120 and 124 and dielectric-to-dielectric bonding such as the bonding between the dielectric layers 118 and 122. In some embodiments, there is no solder elements formed between the chip structures 100A and 100B.

In some embodiments, the chip structure 100B is placed directly on the chip structure 100A. As a result, the dielectric layers 118 and 122 are in direct contact with each other and bonded to each other. The conductive features 120 and 124 are in direct contact with each other.

As mentioned above, before the placing of the chip structure 100B, planarization processes are performed, so as to provide highly planarized bonding surfaces of the chip structures 100A and 100B. In some embodiments, there is no gap between the dielectric layers 118 and 122. In some embodiments, there is no gap between the conductive features 120 and 124. In some embodiments, a thermal operation is then used to enhance the bonding between the conductive features 120 and 124. The temperature of the thermal operation may within a range from about 100 degrees C. to about 700 degrees C.

Figure 1D:
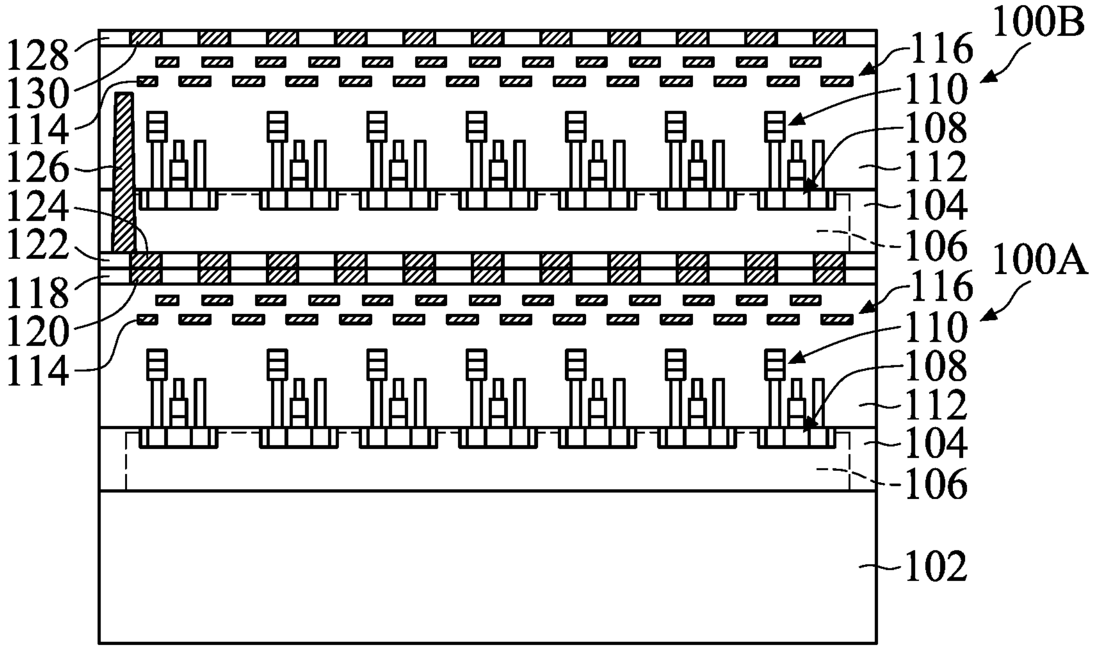

As shown in FIG. 1D, a dielectric layer 128 and multiple conductive features 130 are formed over the front-side interconnection structure 116 of the chip structure 100B, in accordance with some embodiments. The material and formation method of the dielectric layer 128 may be the same as or similar to those of the dielectric layer 118. The material and formation method of the conductive features 130 may be the same as or similar to those of the conductive features 120. The dielectric layer 128 and the conductive features 130 may together function as a bonding structure. Similarly, a planarization process may be used to provide a highly planarized bonding surface of the chip structure 100B.

Figure 1E:
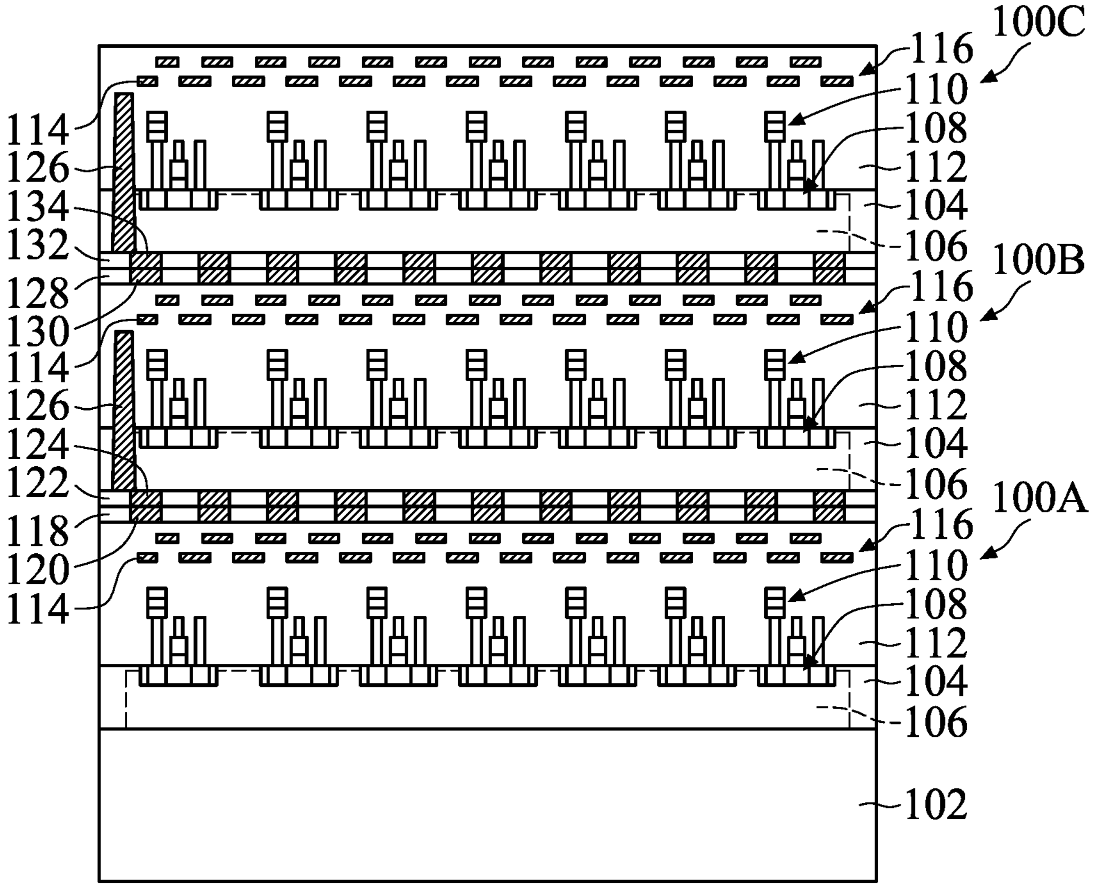

As shown in FIG. 1E, a chip structure 100C is provided. In some embodiments, a dielectric layer 132 and multiple conductive features 134 are formed over the backside of the chip structure 100C. The material and formation method of the dielectric layer 132 may be the same as or similar to those of the dielectric layer 118. The material and formation method of the conductive features 134 may be the same as or similar to those of the conductive features 120. The dielectric layer 132 and the conductive features 134 may together function as a bonding structure. Similarly, a planarization process may be used to provide a highly planarized bonding surface of the chip structure 100C.

As shown in FIG. 1E, similar to the embodiments illustrated in FIGS. 1B-1C, the chip structure 100C is bonded to the chip structure 100B, in accordance with some embodiments. In some embodiments, similar to the chip structure 100B, the chip structure 100C is a memory-containing chip structure such as a semiconductor wafer that includes multiple memory elements. In some embodiments, the memory elements are non-volatile memory elements such as resistive random access memory (RRAM) elements, magnetoresistive random access memory (MRAM) elements, or the like. In some embodiments, the chip structures 100A-100C together form a memory array cube, as shown in FIG. 1E.

Figure 1F:
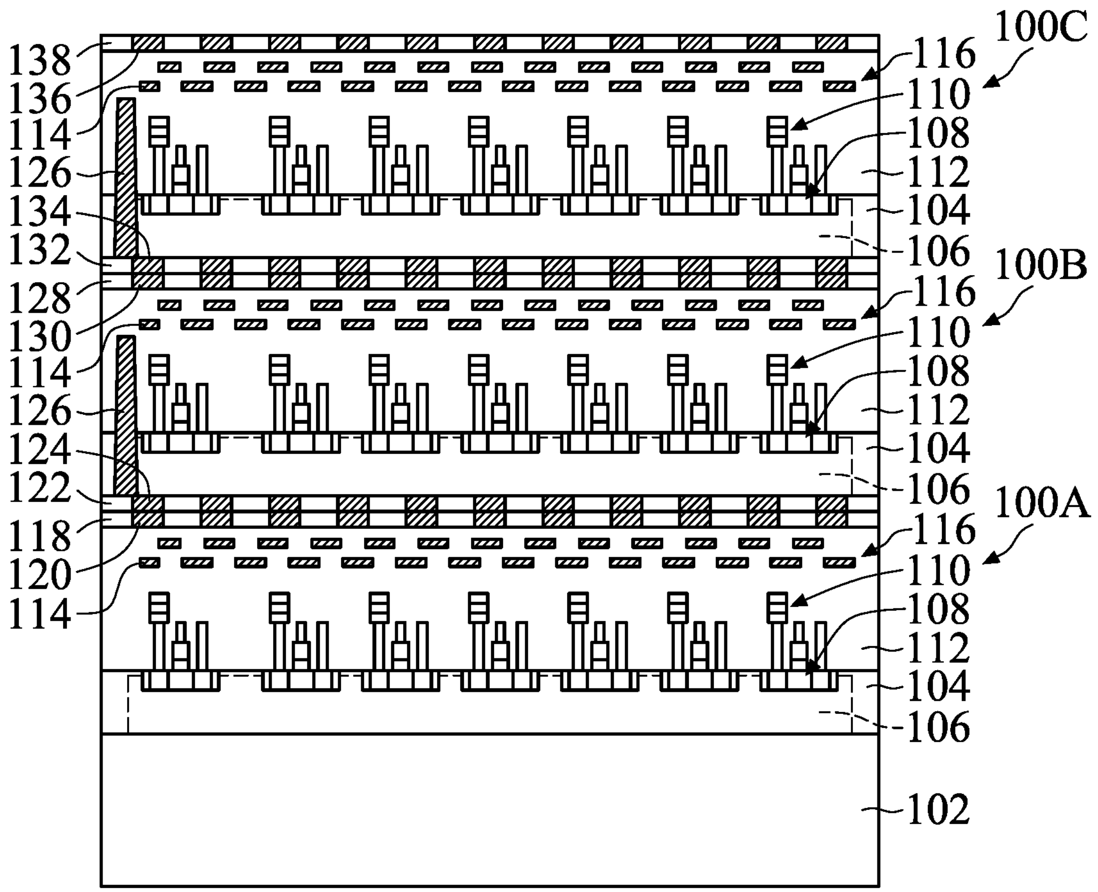

As shown in FIG. 1F, a dielectric layer 138 and multiple conductive features 136 are formed over the front-side interconnection structure 116 of the chip structure 100C, in accordance with some embodiments. The material and formation method of the dielectric layer 138 may be the same as or similar to those of the dielectric layer 118. The material and formation method of the conductive features 136 may be the same as or similar to those of the conductive features 120. The dielectric layer 138 and the conductive features 136 may together function as a bonding structure. Similarly, a planarization process may be used to provide a highly planarized bonding surface of the chip structure 100C.

Figure 1G:
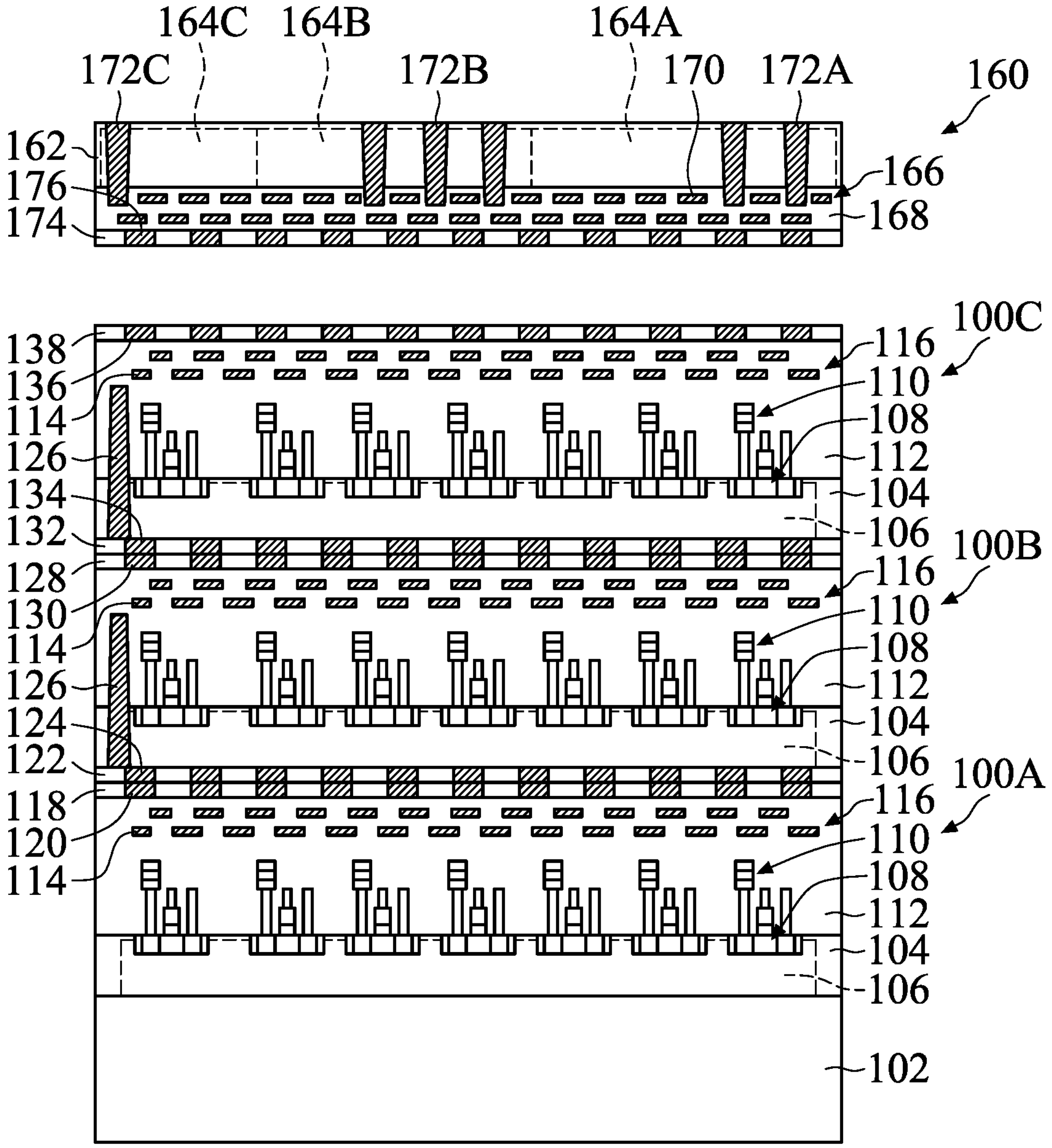

As shown in FIG. 1G, a chip structure 160 is provided to be bonded to the chip structure 100C, in accordance with some embodiments. In some embodiments, the chip structure 160 is a semiconductor wafer. In some embodiments, the chip structure 160 is a logic control chip structure such as a semiconductor wafer that includes multiple logic control elements.

In some embodiments, the chip structure 160 is formed using a more advanced technology node than the chip structures 100A-100C. In some embodiments, the average gate width of the chip structures 100A-100C is wider than the average gate width of the chip structure 160. For example, the average gate width of the chip structures 100A-100C may be in a range from about 5 nm to about 50 nm. The average gate width of the chip structure 160 may be in a range from about 0.5 nm to about 10 nm. In some embodiments, the chip structure 160 includes gate-all-around (GAA) transistors, and the chip structures 100A-100C includes FinFET transistors. In some embodiments, the chip structures 100A-100C do not include any GAA transistors.

As shown in FIG. 1G, the chip structure 160 includes a semiconductor substrate 162. In some embodiments, the semiconductor substrate 162 has multiple device regions 164A, 164B, and 164C. Multiple device elements are formed in and/or on the device regions 164A, 164B, and 164C. Examples of the various device elements include transistors (e.g., metal oxide semiconductor field effect transistors (MOSFET), complementary metal oxide semiconductor (CMOS) transistors, bipolar junction transistors (BJT), or other suitable elements. Various processes may be used to form the various device elements, including deposition, etching, implantation, photolithography, annealing, and/or other suitable processes.

In some embodiments, a front-side interconnection structure 166 is formed on the semiconductor substrate 162 for providing electrical connections to the device features 170 that are surrounded by multiple dielectric layers 168. The conductive features 170 may include conductive contacts, conductive lines, and conductive vias. The formation of the front-side interconnection structure 166 may involve multiple deposition processes, multiple patterning processes, and multiple planarization processes.

The device elements in the device regions 164A, 164B, and 164C of the chip structure 160 may be interconnected by the front-side interconnection structure 166 to form multiple integrated circuit devices. The device elements at the device region 164A may form cache elements, global buffer elements, or the like. The device elements at the device region 164B may form accumulator elements, local buffer elements, activation elements, pooling elements, or the like. The device elements at the device region 164C may form analog-to-digital converter (ADC) elements, input and/or output elements, or the like. The device elements at the device region 164C may be used to convert the analog signals from the chip structures 100A-100C into digital signals. Afterwards, the digital signals may be further transferred to the device regions 164A and/or 164B for further operation.

In some embodiments, multiple through substrate vias including through substrate vias 172A, 172B, and 172C are formed in the chip structure 160, as shown in FIG. 1G. In some embodiments, the through substrate vias 172A, 172B, and 172C provide electrical connections to the devices elements formed at the device regions 164A, 164B, and 164C, respectively. In some embodiments, each of the through substrate vias 172A, 172B, and 172C extends from the backside of the chip structure 160 towards the front-side interconnection structure 166 of the chip structure 160.

In some embodiments, a dielectric layer 174 and multiple conductive features 176 are formed over the front-side interconnection structure 166 of the chip structure 160, as shown in FIG. 1G. The material and formation method of the dielectric layer 174 may be the same as or similar to those of the dielectric layer 118. The material and formation method of the conductive features 176 may be the same as or similar to those of the conductive features 120. The dielectric layer 174 and the conductive features 176 may together function as a bonding structure. Similarly, a planarization process may be used to provide a highly planarized bonding surface of the chip structure 160.

Figure 1H:
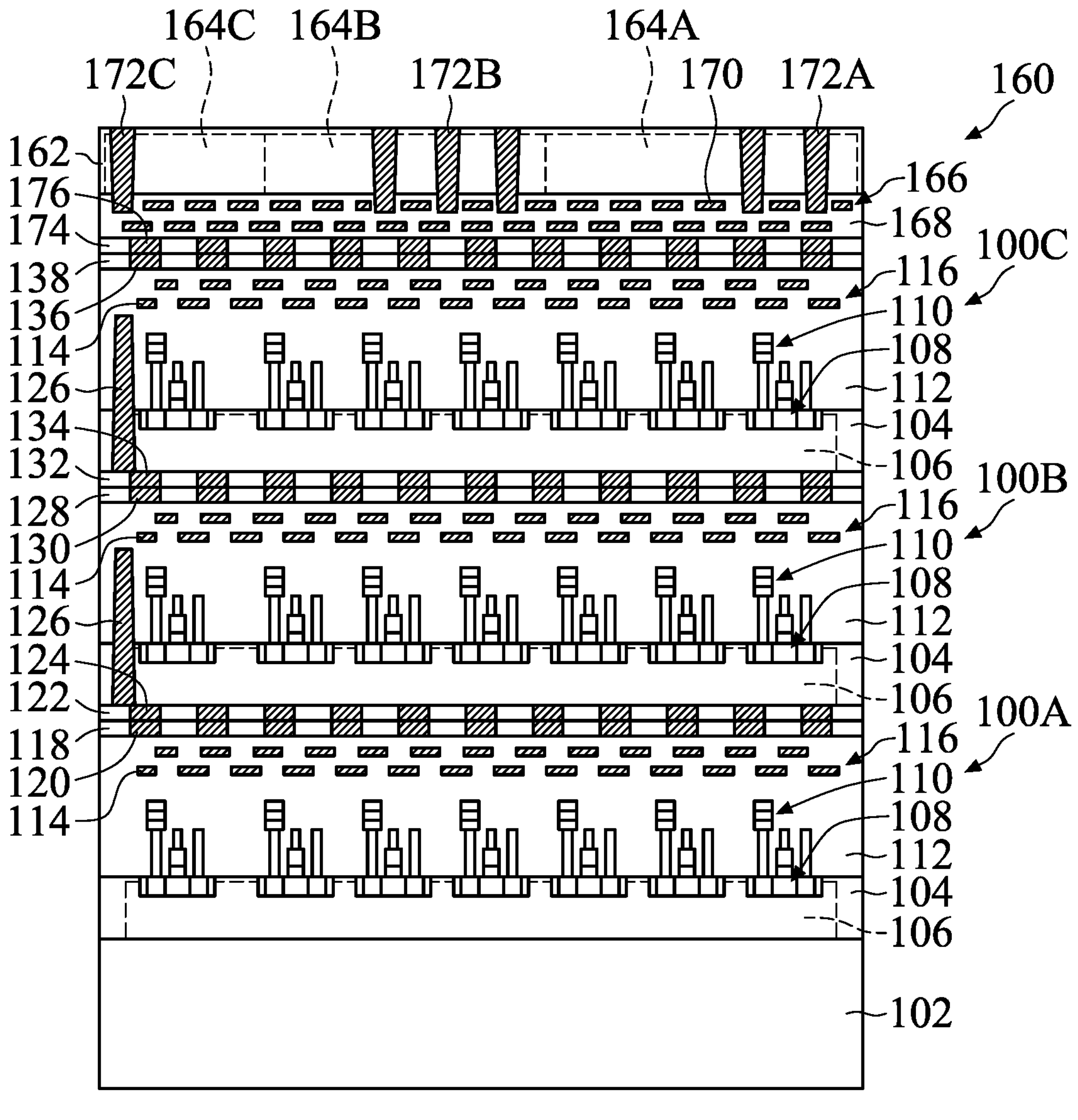

As shown in FIG. 1H, the chip structure 160 is bonded to the chip structure 100C through direct bonding, in accordance with some embodiments. The direct bonding may be may be achieved using a hybrid bonding, a fusion bonding, or the like. The hybrid bonding may include metal-to-metal bonding such as the bonding between the conductive features 136 and 176 and dielectric-to-dielectric bonding such as the bonding between the dielectric layers 138 and 174. In some embodiments, there is no solder elements formed between the chip structures 100C and 160.

In some embodiments, the chip structure 160 is placed directly on the chip structure 100C. As a result, the dielectric layers 138 and 174 are in direct contact with each other. The conductive features 136 and 176 are in direct contact with each other.

As mentioned above, before the placing of the chip structure 160, planarization processes are performed, so as to provide highly planarized bonding surfaces of the chip structures 100C and 160. In some embodiments, there is no gap between the dielectric layers 138 and 174. In some embodiments, there is no gap between the conductive features 136 and 176. In some embodiments, a thermal operation is then used to enhance the bonding between the conductive features 136 and 176. The temperature of the thermal operation may within a range from about 100 degrees C. to about 700 degrees C.

In some embodiments, the through substrate vias 126 are used to provide communication between the device elements in the device regions 106 of the chip structures 100A-100C and the device elements in the device region 164C of the chip structure 160. For example, one of the memory cells formed in the chip structure 100A may be electrically connected to one of the ADC elements formed in the device region 164C of the chip structure 160 by some of the through substrate vias 126. In some embodiments, the through substrate vias 126 vertically overlap the device region 164C of the chip structure 160, as shown in FIG. 1H.

Figure 1I:
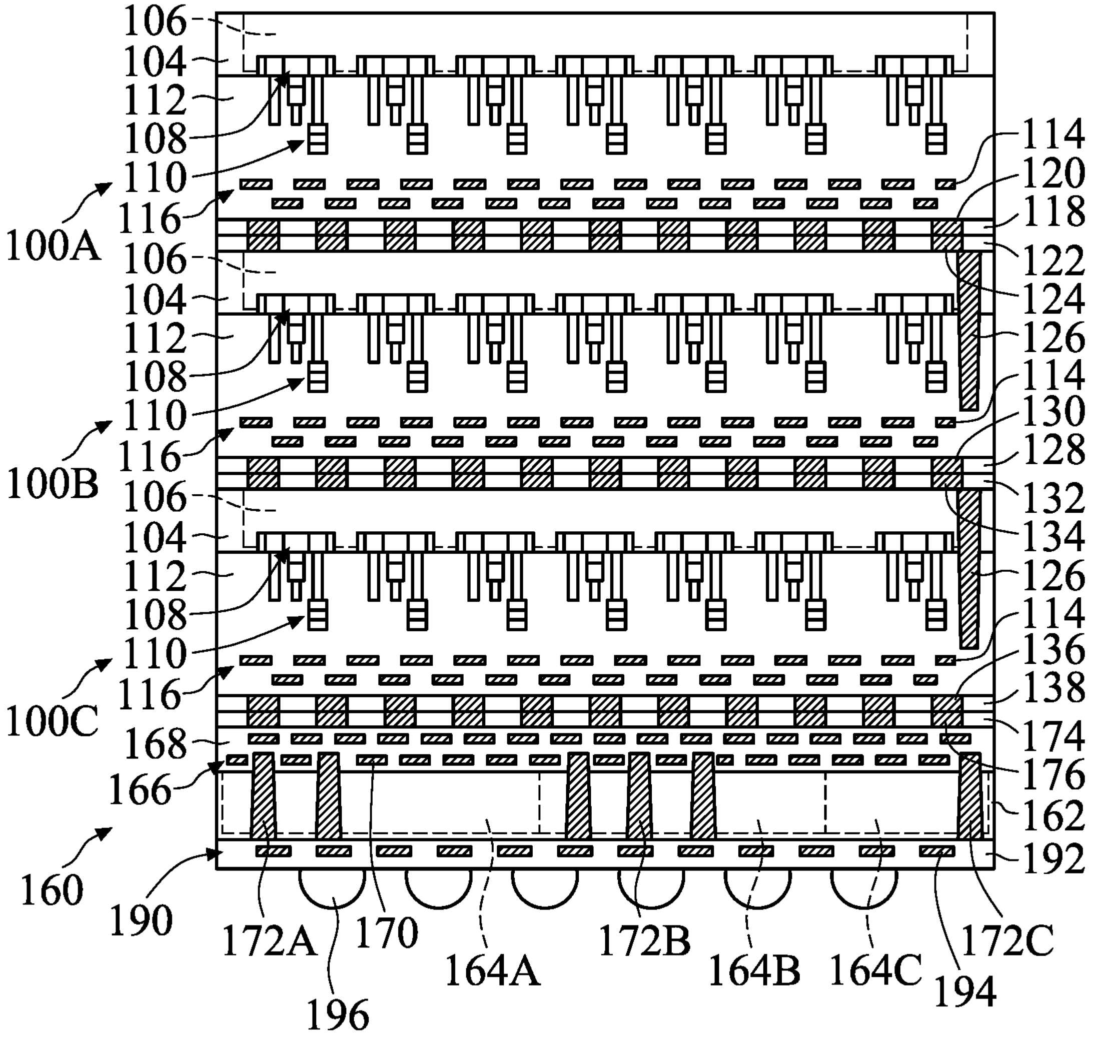

Afterwards, the carrier substrate 102 is removed, and redistribution structure 190 and conductive bumps 196 are then formed on the chip structure 160, as shown in FIG. 1I in accordance with some embodiments. The redistribution structure 190 may include multiple insulating layers 192 and multiple conductive features 194. The conductive features 194 may be used to provide electrical connections between the conductive bumps 196 and the through substrate vias 172A-172C. In some embodiments, the insulating layers 192 are made of or include silicon oxide, carbon-containing silicon oxide, silicon oxynitride, carbon-containing silicon oxynitride, polyimide, polybenzoxazole (PBO), one or more other suitable materials, or a combination thereof.

The conductive features 194 may include conductive line and conductive vias. The conductive features 194 may be made of or include copper, cobalt, aluminum, gold, one or more other suitable materials, or a combination thereof. The formation of the redistribution structure 190 may involve multiple deposition processes, multiple patterning processes, and multiple planarization processes.

The conductive bumps 196 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, one or more dicing operations are used to separate the bonded chip structures (or bonded wafers) into multiple package structures. One of the package structures is shown in FIG. 1I. The package structure may function as a system on integrated chips (SoIC) that may further be integrated into a chip on wafer on substrate (CoWoS) package structure, an integrated fan-out (InFO) package structure, or the like. The package structure may be used as a RRAM accelerator. The RRAM accelerator may be further bonded to a high performance chip and/or an artificial intelligence (AI) chip to achieve in-memory or near-memory computing. In some other embodiments, no dicing operation is performed. The entirety of the bonded wafers forms a package structure.

In some embodiments illustrated in FIGS. 1A-1I, the chip structures 100A-100C include multiple memory cells. However, many variations and/or modifications can be made to embodiments of the disclosure. In some other embodiments, one or more of the chip structures 100A-100C further have device regions that include device elements other than the memory cells.

Figure 2A:
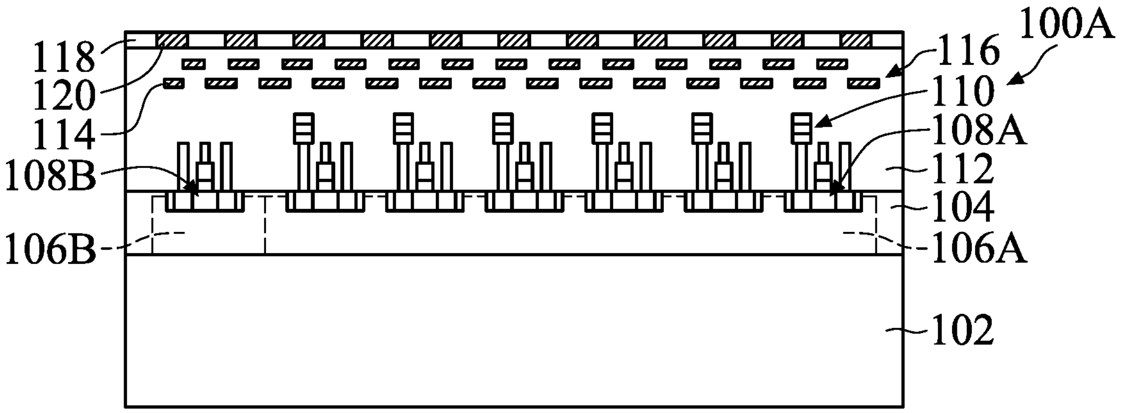
FIGS. 2A-2G are cross-sectional views of various stages of a process for forming a package structure, in accordance with some embodiments.

FIGS. 2A-2G are cross-sectional views of various stages of a process for forming a package structure, in accordance with some embodiments. As shown in FIG. 2A, similar to the embodiments illustrated in FIG. 1A, a chip structure (or a chip-containing structure) 100A is disposed over a carrier substrate 102, in accordance with some embodiments.

In some embodiments, the chip structure 100A is a semiconductor wafer. In some embodiments, the chip structure 100A is a memory-containing chip structure such as a semiconductor wafer that includes multiple memory elements. In some embodiments, the memory elements are non-volatile memory elements such as resistive random access memory (RRAM) elements, magnetoresistive random access memory (MRAM) elements, or the like.

In some embodiments, the semiconductor substrate 104 has device regions 106A and 106B. Multiple device elements are formed in and/or on the device regions 106A and 106B. Examples of the various device elements include transistors (e.g., metal oxide semiconductor field effect transistors (MOSFET), complementary metal oxide semiconductor (CMOS) transistors, bipolar junction transistors (BJT), or other suitable elements. Various processes may be used to form the various device elements, including deposition, etching, implantation, photolithography, annealing, and/or other suitable processes.

In some embodiments, a front-side interconnection structure 116 is formed on the semiconductor substrate 104 for providing electrical connections to the device elements. The front-side interconnection structure 116 includes multiple conductive features 114 that are surrounded by multiple dielectric layers 112. The conductive features 114 may include conductive contacts, conductive lines, and conductive vias. The formation of the front-side interconnection structure 116 may involve multiple deposition processes, multiple patterning processes, and multiple planarization processes.

The device elements in the device regions 106A and 106B of the chip structure 100A may be interconnected by the front-side interconnection structure 116 to form integrated circuit devices. In some embodiments, the device elements at the device region 106A may form memory cell array elements, word line switch elements, level shifter elements, or the like. In some embodiments, the device elements at the device region 106B may form analog-to-digital converter (ADC) elements, input and/or output elements, or the like.

In some embodiments, the chip structure 100A includes multiple transistors 108A and multiple resistive elements 110 at the device region 106A, as shown in FIG. 2A. The chip structure 100A also includes multiple transistors 108B at the device region 106B. The transistors 108A and the resistive elements 110 may together form a memory cell array such as a resistive random access memory (RRAM) cell array. Each of the resistive elements 110 may include a resistance variable layer that is sandwiched between a lower electrode and an upper electrode. The lower electrode of the resistive element 110 may be electrically connected to a drain feature of the respective transistor 108A, as shown in FIG. 2A.

As shown in FIG. 2A, a dielectric layer 118 and multiple conductive features 120 are formed over the front-side interconnection structure 116, in accordance with some embodiments. The dielectric layer 118 and the conductive features 120 may function as bonding structures. The material and formation method of the dielectric layer 118 may be the same as or similar to those of the dielectric layer 118 illustrated in FIG. 1A. The material and formation method of the conductive features 120 may be the same as or similar to those of the conductive features 120 illustrated in FIG. 1A. The formation of the conductive features 120 and the dielectric layer 118 may involve a planarization process such as a CMP process. The planarization process may be used to provide a highly planarized bonding surface of the chip structure 100A.

Figure 2B:
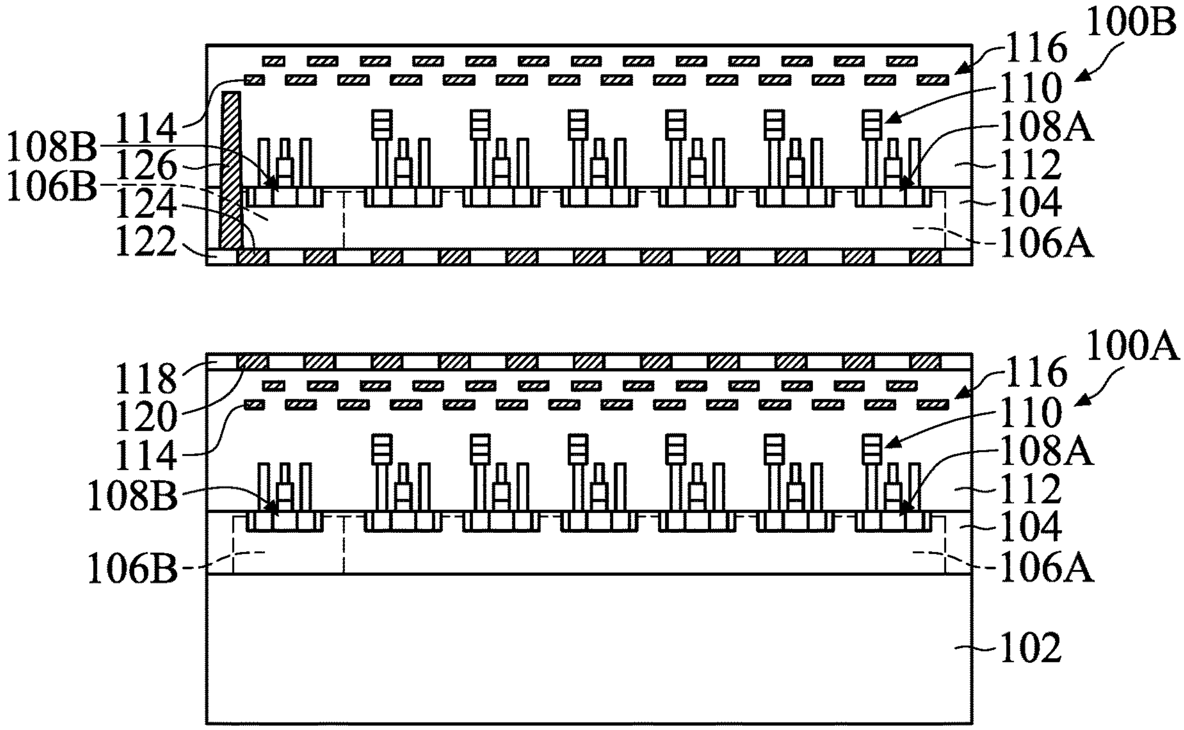

As shown in FIG. 2B, a chip structure 100B is provided to be bonded to the chip structure 100A, in accordance with some embodiments. In some embodiments, similar to the chip structure 100A, the chip structure 100B also includes the device regions 106A and 106B.

In some embodiments, multiple through substrate vias including a through substrate via 126 are formed in the chip structure 100B, as shown in FIG. 2B. In some embodiments, the through substrate via 126 extends from the backside of the chip structure 100B towards the front-side interconnection structure 116 of the chip structure 100B.

In some embodiments, a dielectric layer 122 and multiple conductive features 124 are formed over the backside of the chip structure 100B, as shown in FIG. 2B. The material and formation method of the dielectric layer 122 may be the same as or similar to those of the dielectric layer 118. The material and formation method of the conductive features 124 may be the same as or similar to those of the conductive features 120. The dielectric layer 122 and the conductive features 124 may together function as a bonding structure. Similarly, a planarization process may be used to provide a highly planarized bonding surface of the chip structure 100B.

Figure 2C:
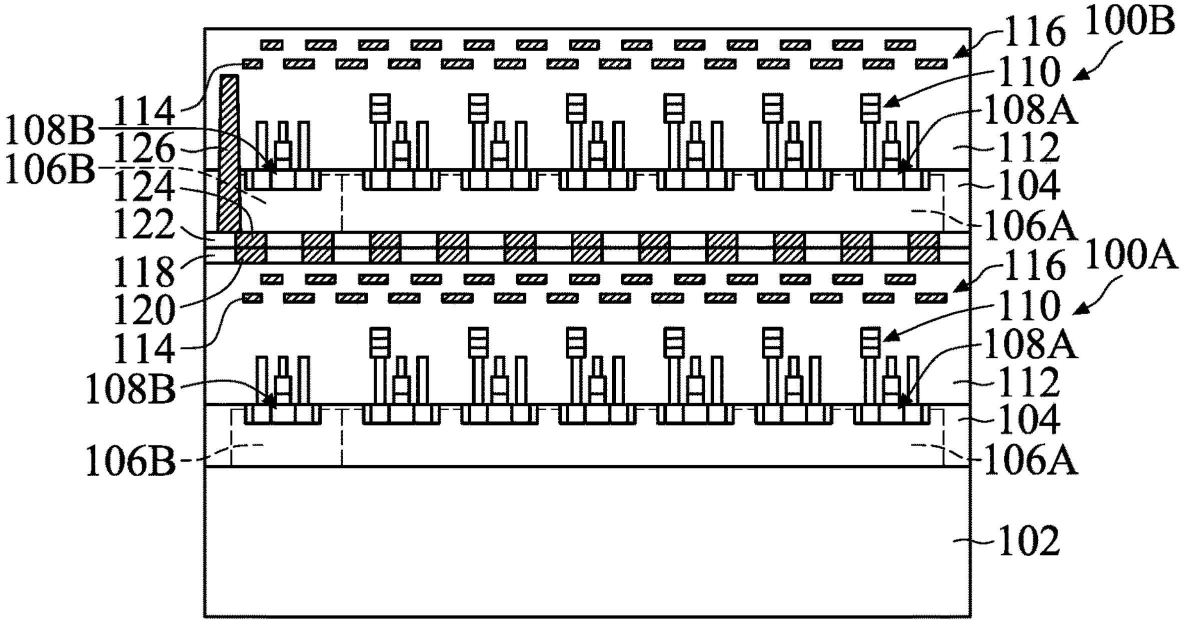

As shown in FIG. 2C, the chip structure 100B is bonded to the chip structure 100A through direct bonding, in accordance with some embodiments. The direct bonding may be achieved using a hybrid bonding, a fusion bonding, or the like. The hybrid bonding may include metal-to-metal bonding such as the bonding between the conductive features 120 and 124 and dielectric-to-dielectric bonding such as the bonding between the dielectric layers 118 and 122. In some embodiments, there is no solder elements formed between the chip structures 100A and 100B.

In some embodiments, the chip structure 100B is placed directly on the chip structure 100A. As a result, the dielectric layers 118 and 122 are in direct contact with each other and bonded to each other. The conductive features 120 and 124 are in direct contact with each other.

As mentioned above, before the placing of the chip structure 100B, planarization processes are performed, so as to provide highly planarized bonding surfaces of the chip structures 100A and 100B. In some embodiments, there is no gap between the dielectric layers 118 and 122. In some embodiments, there is no gap between the conductive features 120 and 124. In some embodiments, a thermal operation is then used to enhance the bonding between the conductive features 120 and 124. The temperature of the thermal operation may within a range from about 100 degrees C. to about 700 degrees C.

Figure 2D:
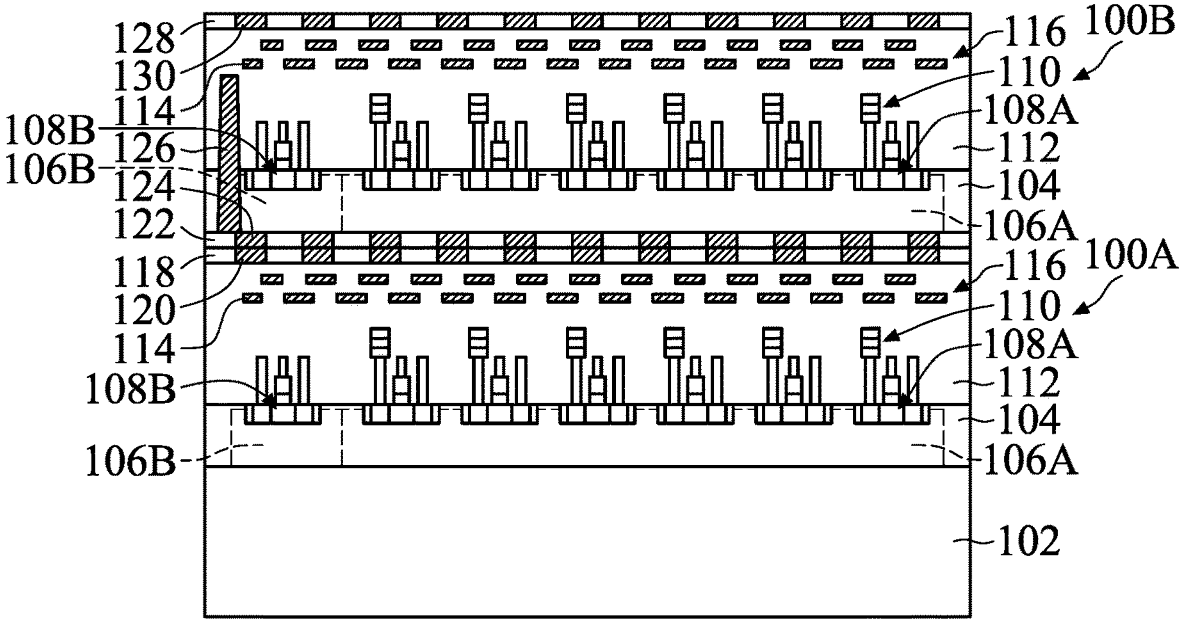

As shown in FIG. 2D, a dielectric layer 128 and multiple conductive features 130 are formed over the front-side interconnection structure 116 of the chip structure 100B, in accordance with some embodiments. The material and formation method of the dielectric layer 128 may be the same as or similar to those of the dielectric layer 118. The material and formation method of the conductive features 130 may be the same as or similar to those of the conductive features 120. The dielectric layer 128 and the conductive features 130 may together function as a bonding structure. Similarly, a planarization process may be used to provide a highly planarized bonding surface of the chip structure 100B.

Figure 2E:
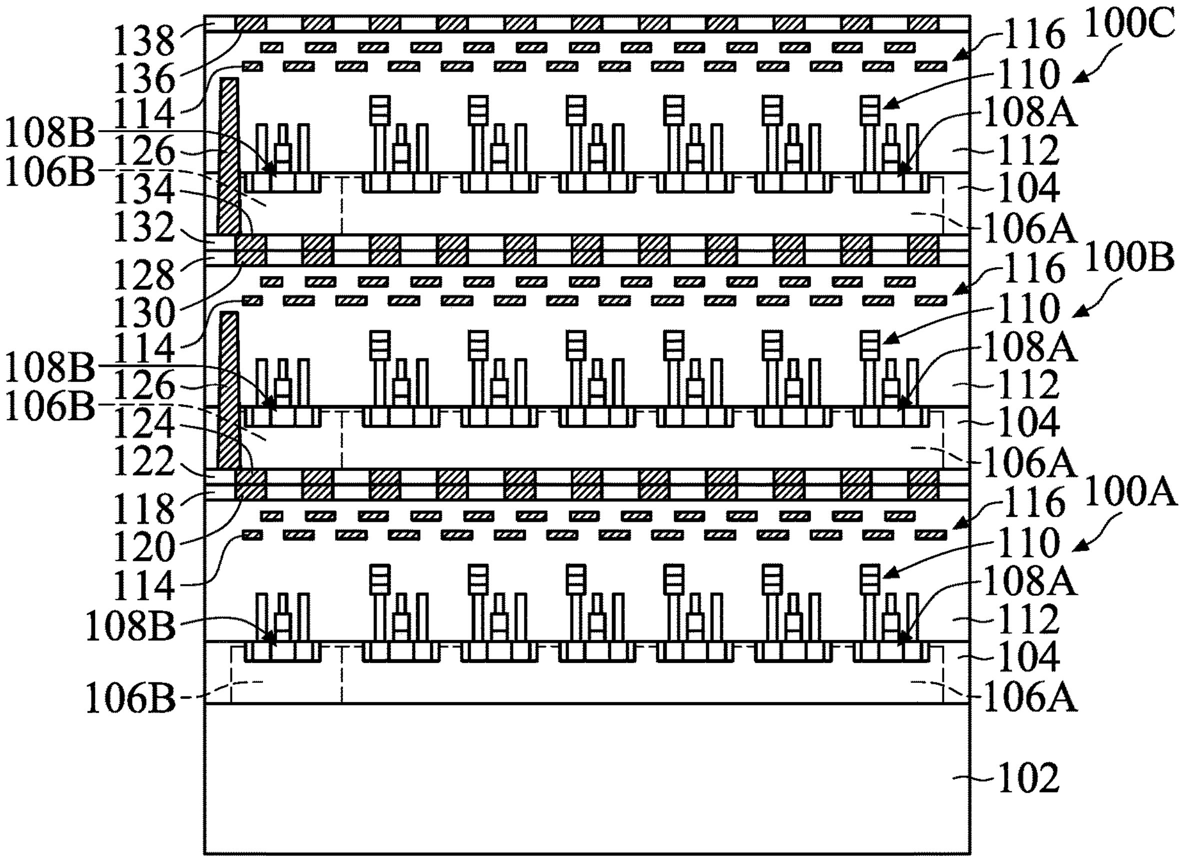

As shown in FIG. 2E, a chip structure 100C is provided. In some embodiments, a dielectric layer 132 and multiple conductive features 134 are formed over the backside of the chip structure 100C. The material and formation method of the dielectric layer 132 may be the same as or similar to those of the dielectric layer 118. The material and formation method of the conductive features 134 may be the same as or similar to those of the conductive features 120. The dielectric layer 132 and the conductive features 134 may together function as a bonding structure. Similarly, a planarization process may be used to provide a highly planarized bonding surface of the chip structure 100C.

As shown in FIG. 2E, similar to the embodiments illustrated in FIGS. 2B-2C, the chip structure 100C is bonded to the chip structure 100B, in accordance with some embodiments. In some embodiments, the chip structures 100A-100C together form a memory array cube, as shown in FIG. 2E.

Figure 2F:
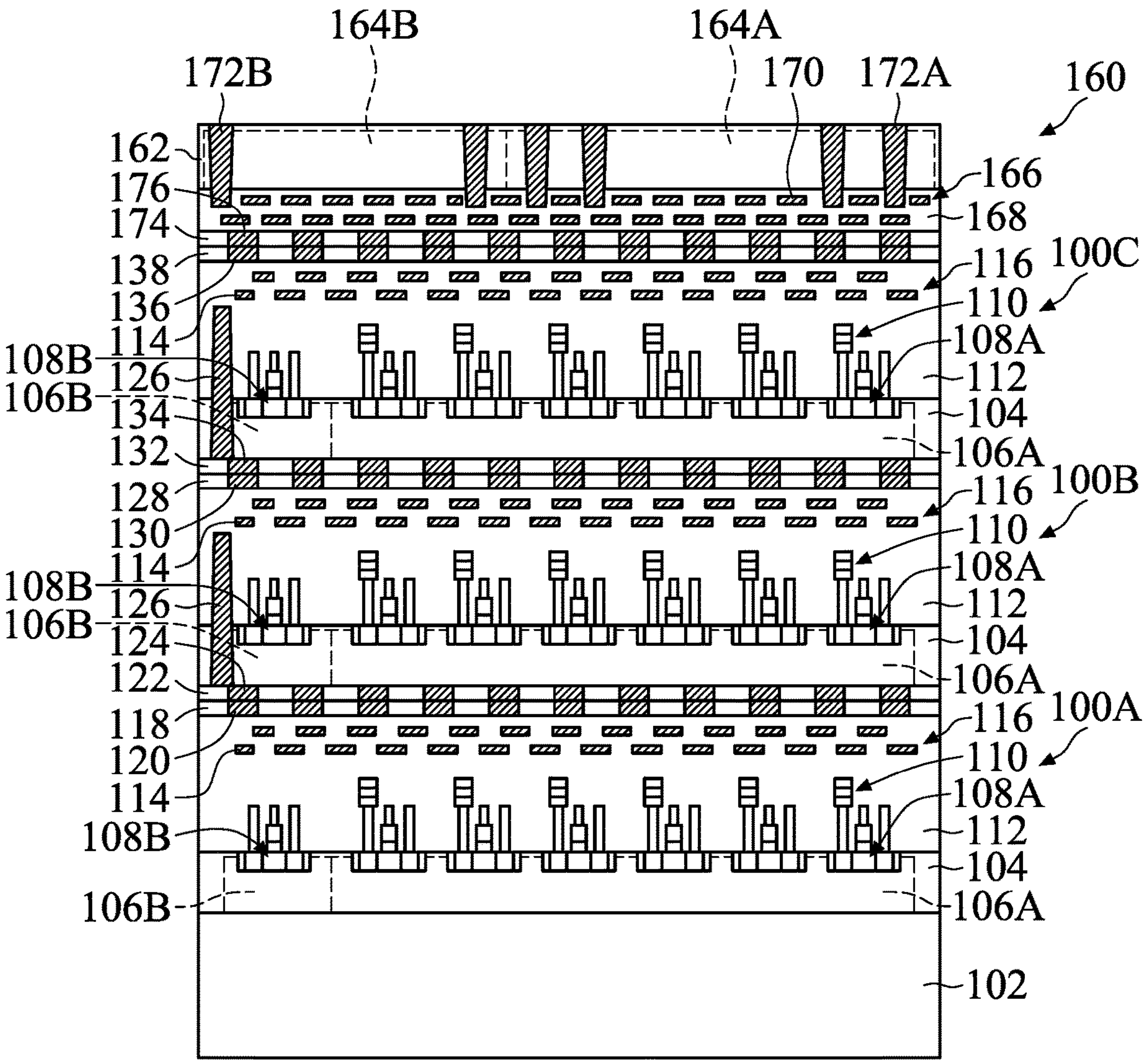

As shown in FIG. 2F, a dielectric layer 138 and multiple conductive features 136 are formed over the front-side interconnection structure 116 of the chip structure 100C, in accordance with some embodiments. The material and formation method of the dielectric layer 138 may be the same as or similar to those of the dielectric layer 118. The material and formation method of the conductive features 136 may be the same as or similar to those of the conductive features 120. The dielectric layer 138 and the conductive features 136 may together function as a bonding structure. Similarly, a planarization process may be used to provide a highly planarized bonding surface of the chip structure 100C.

Afterwards, a chip structure 160 is provided and bonded to the chip structure 100C, in accordance with some embodiments. In some embodiments, the chip structure 160 is a semiconductor wafer. In some embodiments, the chip structure 160 is a logic control chip structure such as a semiconductor wafer that includes multiple logic control elements.

In some embodiments, the chip structure 160 is formed using a more advanced technology node than the chip structures 100A-100C. In some embodiments, the average gate width of the chip structures 100A-100C is wider than the average gate width of the chip structure 160. In some embodiments, the chip structure 160 includes gate-all-around (GAA) transistors, and the chip structures 100A-100C includes FinFET transistors. In some embodiments, the chip structures 100A-100C do not include any GAA transistors.

As shown in FIG. 2F, the chip structure 160 includes a semiconductor substrate 162. In some embodiments, the semiconductor substrate 162 has multiple device regions 164A and 164B. Multiple device elements are formed in and/or on the device regions 164A and 164B. Examples of the various device elements include transistors (e.g., metal oxide semiconductor field effect transistors (MOSFET), complementary metal oxide semiconductor (CMOS) transistors, bipolar junction transistors (BJT), or other suitable elements. Various processes may be used to form the various device elements, including deposition, etching, implantation, photolithography, annealing, and/or other suitable processes.

In some embodiments, a front-side interconnection structure 166 is formed on the semiconductor substrate 162 for providing electrical connections to the device features 170 that are surrounded by multiple dielectric layers 168. The conductive features 170 may include conductive contacts, conductive lines, and conductive vias. The formation of the front-side interconnection structure 166 may involve multiple deposition processes, multiple patterning processes, and multiple planarization processes.

The device elements in the device regions 164A and 164B of the chip structure 160 may be interconnected by the front-side interconnection structure 166 to form multiple integrated circuit devices. The device elements at the device region 164A may form cache elements, global buffer elements, or the like. The device elements at the device region 164B may form accumulator elements, local buffer elements, activation elements, pooling elements, or the like.

The device elements at the device regions 106B of the chip structures 100A-100C may be used to convert the analog signals from the device regions 106A of the chip structures 100A-100C into digital signals. Afterwards, the digital signals may be further transferred to the device regions 164B of the chip structure 160 for further operation. In some embodiments, the through substrate vias 126 in the chip structures 100B and 100C are used to provide communication between the device elements in the device regions 106B and 164B. The digital signals may thus be transferred to the chip structure 160 through the through substrate vias 126 for further operation. In some embodiments, the through substrate vias 126 vertically overlap the device region 164B of the chip structure 160, as shown in FIG. 2F.

In some embodiments, multiple through substrate vias including through substrate vias 172A and 172B are formed in the chip structure 160, as shown in FIG. 2F. In some embodiments, the through substrate vias 172A and 172B provide electrical connections to the devices elements formed at the device regions 164A and 164B, respectively. In some embodiments, each of the through substrate vias 172A and 172B extends from the backside of the chip structure 160 towards the front-side interconnection structure 166 of the chip structure 160.

In some embodiments, a dielectric layer 174 and multiple conductive features 176 are formed over the front-side interconnection structure 166 of the chip structure 160, as shown in FIG. 2F. The material and formation method of the dielectric layer 174 may be the same as or similar to those of the dielectric layer 118. The material and formation method of the conductive features 176 may be the same as or similar to those of the conductive features 120. The dielectric layer 174 and the conductive features 176 may together function as a bonding structure. Similarly, a planarization process may be used to provide a highly planarized bonding surface of the chip structure 160.

Afterwards, the chip structure 160 is bonded to the chip structure 100C through direct bonding, as shown in FIG. 2F in accordance with some embodiments. The direct bonding may be may be achieved using a hybrid bonding, a fusion bonding, or the like. The hybrid bonding may include metal-to-metal bonding such as the bonding between the conductive features 136 and 176 and dielectric-to-dielectric bonding such as the bonding between the dielectric layers 138 and 174. In some embodiments, there is no solder elements formed between the chip structures 100C and 160.

In some embodiments, the chip structure 160 is placed directly on the chip structure 100C. As a result, the dielectric layers 138 and 174 are in direct contact with each other and bonded to each other. The conductive features 136 and 176 are in direct contact with each other.

As mentioned above, before the placing of the chip structure 160, planarization processes are performed, so as to provide highly planarized bonding surfaces of the chip structures 100C and 160. In some embodiments, there is no gap between the dielectric layers 138 and 174. In some embodiments, there is no gap between the conductive features 136 and 176. In some embodiments, a thermal operation is then used to enhance the bonding between the conductive features 136 and 176. The temperature of the thermal operation may within a range from about 100 degrees C. to about 700 degrees C.

Figure 2G:
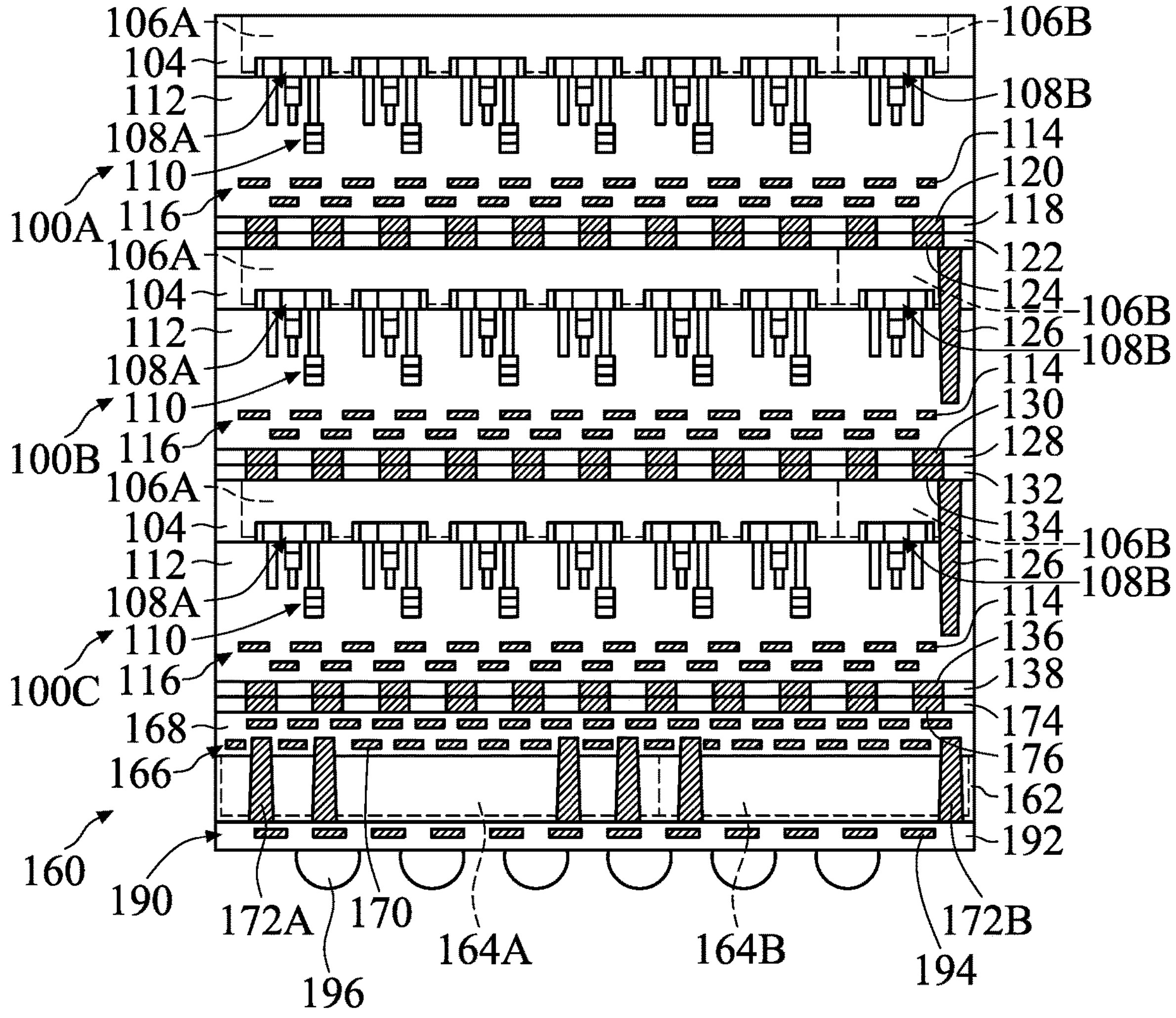

As shown in FIG. 2G, similar to the embodiments illustrated in FIG. 1I, after the removal of the carrier substrate 102 and the formation of the redistribution structure 190 and the conductive bumps 196, a package structure is formed, in accordance with some embodiments. Similar to the embodiments illustrated in FIG. 1I, the redistribution structure 190 includes multiple insulating layers 192 and multiple conductive features 194. One or more dicing processes may then be used to separate the package structure into multiple smaller package structures.

Many variations and/or modifications can be made to embodiments of the disclosure. In the embodiments illustrated in FIG. 2G, the redistribution structure 190 is formed on the backside of the chip structure 160. However, embodiments of the disclosure are not limited thereto. In some other embodiments, the redistribution structure is formed on the backside of the chip structure 100A.

Figure 3A:
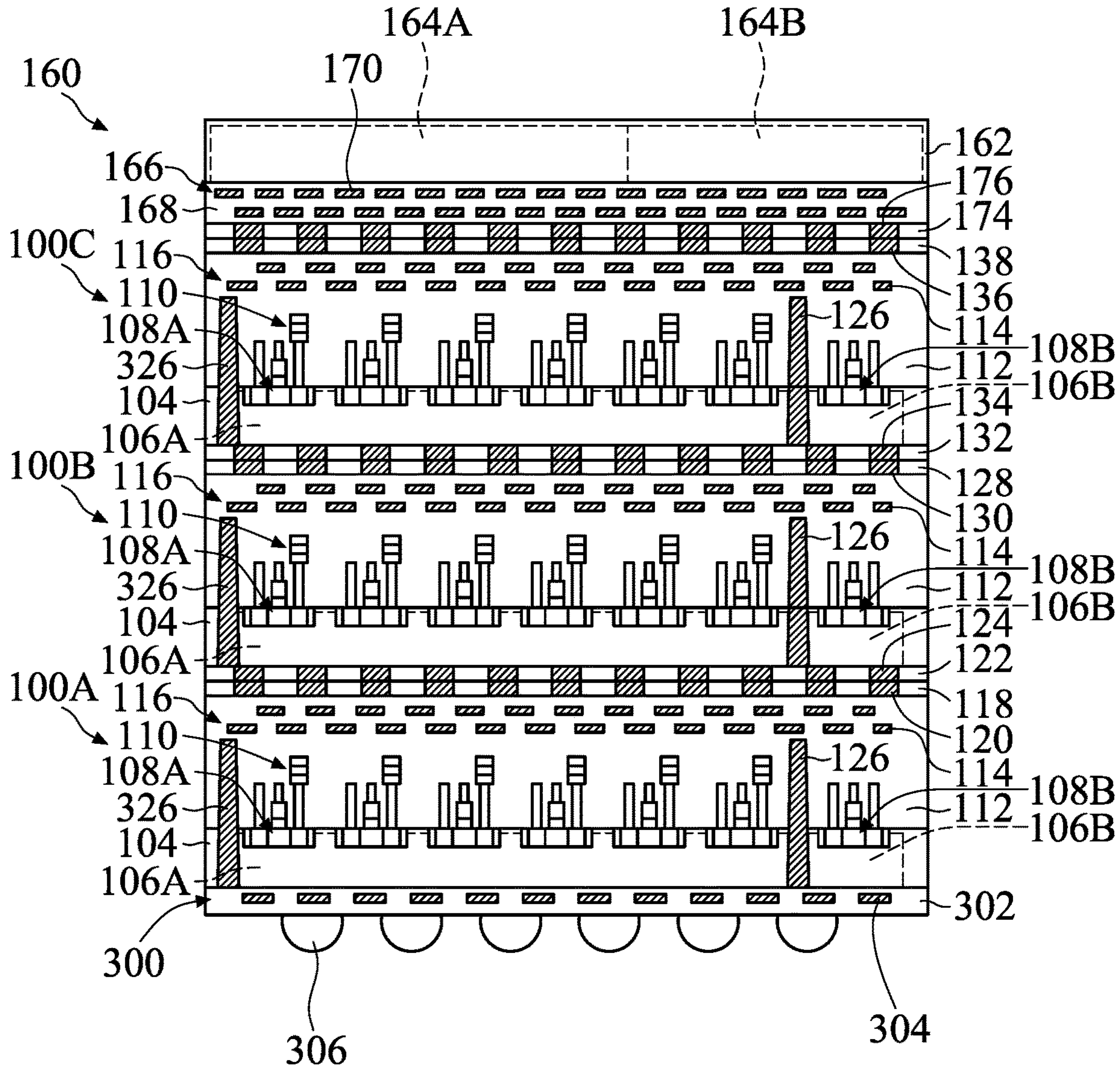
FIGS. 3A-3B are cross-sectional views of various stages of a process for forming a package structure, in accordance with some embodiments.
Figure 3B:
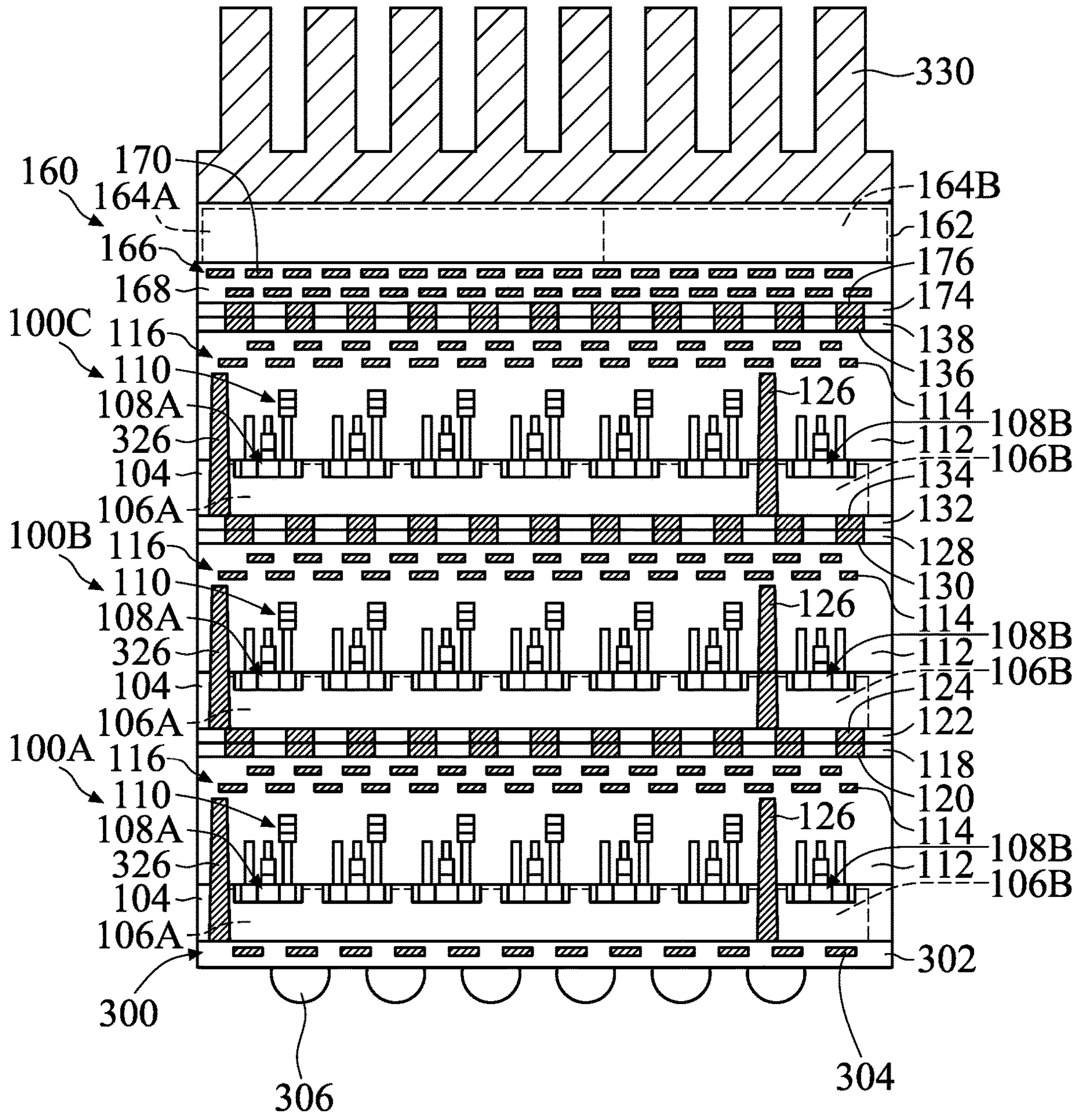

FIGS. 3A-3B are cross-sectional views of various stages of a process for forming a package structure, in accordance with some embodiments. As shown in FIG. 3A, a structure similar to the structure shown in FIG. 2G is formed. In some embodiments, unlike the embodiments shown in FIG. 2G, no redistribution structure is formed on the backside of the chip structure 160. The backside of the chip structure 160 is exposed, as shown in FIG. 3A.

In some embodiments, the chip structure 160 does not have a through substrate via. In some embodiments, similar to the chip structures 100B and 100C, the chip structure 100A also includes one or more through substrate vias 126. In some embodiments, the through substrate vias 126 of the chip structures 100A-100C vertically overlap the device region 164B of the chip structure 160. In some embodiments, the chip structures 100A-100C further include through substrate vias 326. The through substrate vias 326 may be used to provide input and output interconnects and/or power interconnects to the chip structure 160.

In some embodiments, a redistribution structure 300 is formed on the backside of the chip structure 100A, as shown in FIG. 3A. The redistribution structure 300 includes multiple insulating layers 302 and multiple conductive features 304. The material and formation method of the redistribution structure 300 may be the same as or similar to those of the redistribution structure 190 illustrated in FIG. 1I. Afterwards, multiple conductive bumps 306 are formed, as shown in FIG. 3A.

As shown in FIG. 3B, a heat sink 330 is disposed over the backside of the chip structure 160, in accordance with some embodiments. The heat sink 330 may be made of or include copper, aluminum, steel, one or more other thermal conductive materials, or a combination thereof. In some embodiments, the chip structure 160 is a logic control chip structure which may generate much thermal energy during operation. The heat sink 330 may help to lead out the thermal energy, so as to ensure that the chip structure 160 can operate at a lower temperature. The performance and reliability of the package structure are improved.

As mentioned above, the chip structure may function as a system on integrated chips (SoIC) that may further be integrated into a chip on wafer on substrate (CoWoS) package structure, an integrated fan-out (InFO) package structure, or the like. In some embodiments, the heat sink 330 is disposed on the chip structure 160 before the package structure is integrated into another package structure such as a CoWoS package structure, an InFO package structure, or the like. In some other embodiments, the heat sink 330 is disposed after the entire or partial of the packaging processes of the CoWoS package structure or the InFO package structure are performed.

Many variations and/or modifications can be made to embodiments of the disclosure. In the embodiments illustrated in FIG. 1I, the redistribution structure 190 is formed on the backside of the chip structure 160. However, embodiments of the disclosure are not limited thereto. In some other embodiments, the redistribution structure is formed on the backside of the chip structure 100A.

Figure 4A:
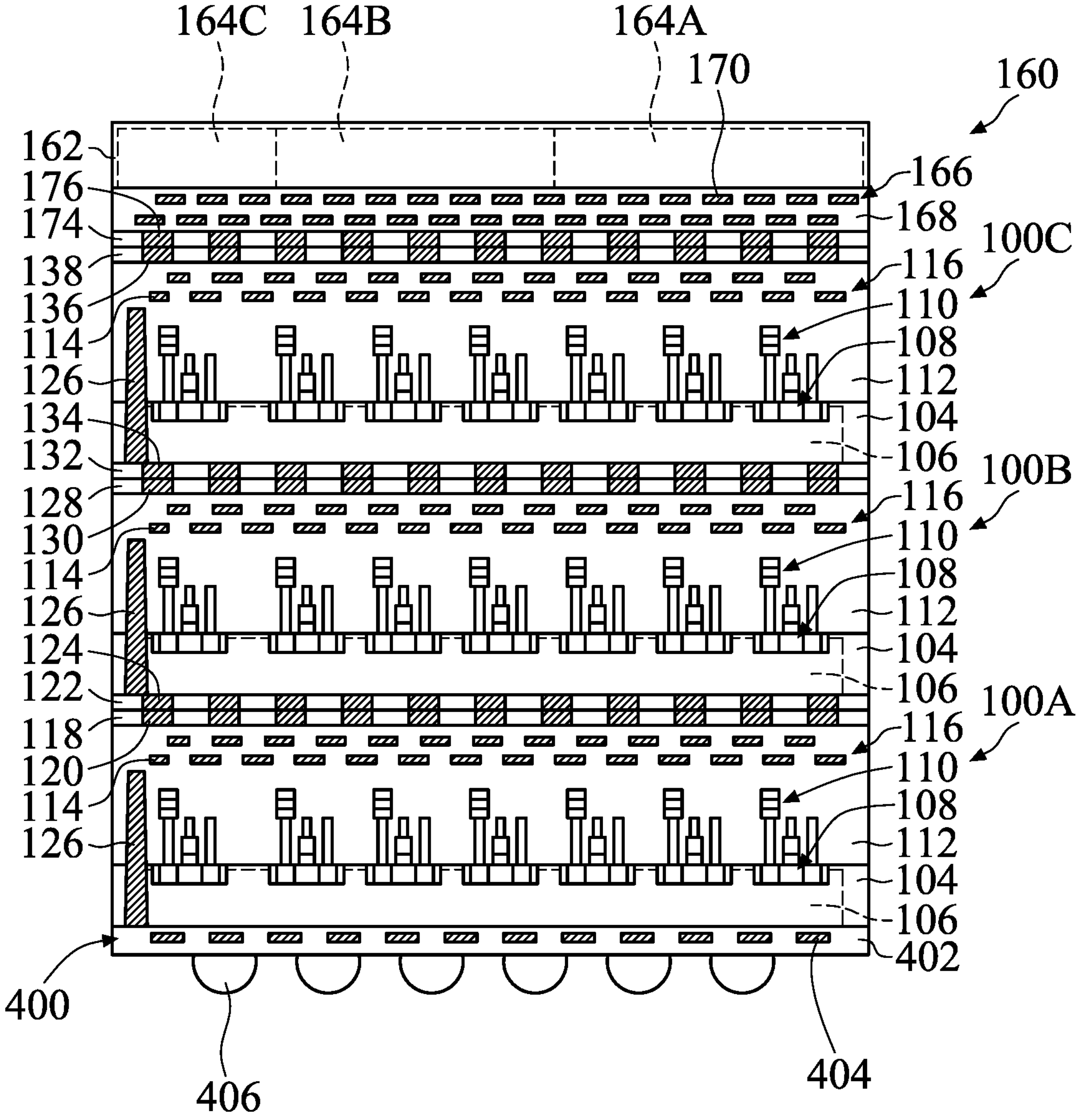
FIGS. 4A-4B are cross-sectional views of various stages of a process for forming a package structure, in accordance with some embodiments.
Figure 4B:
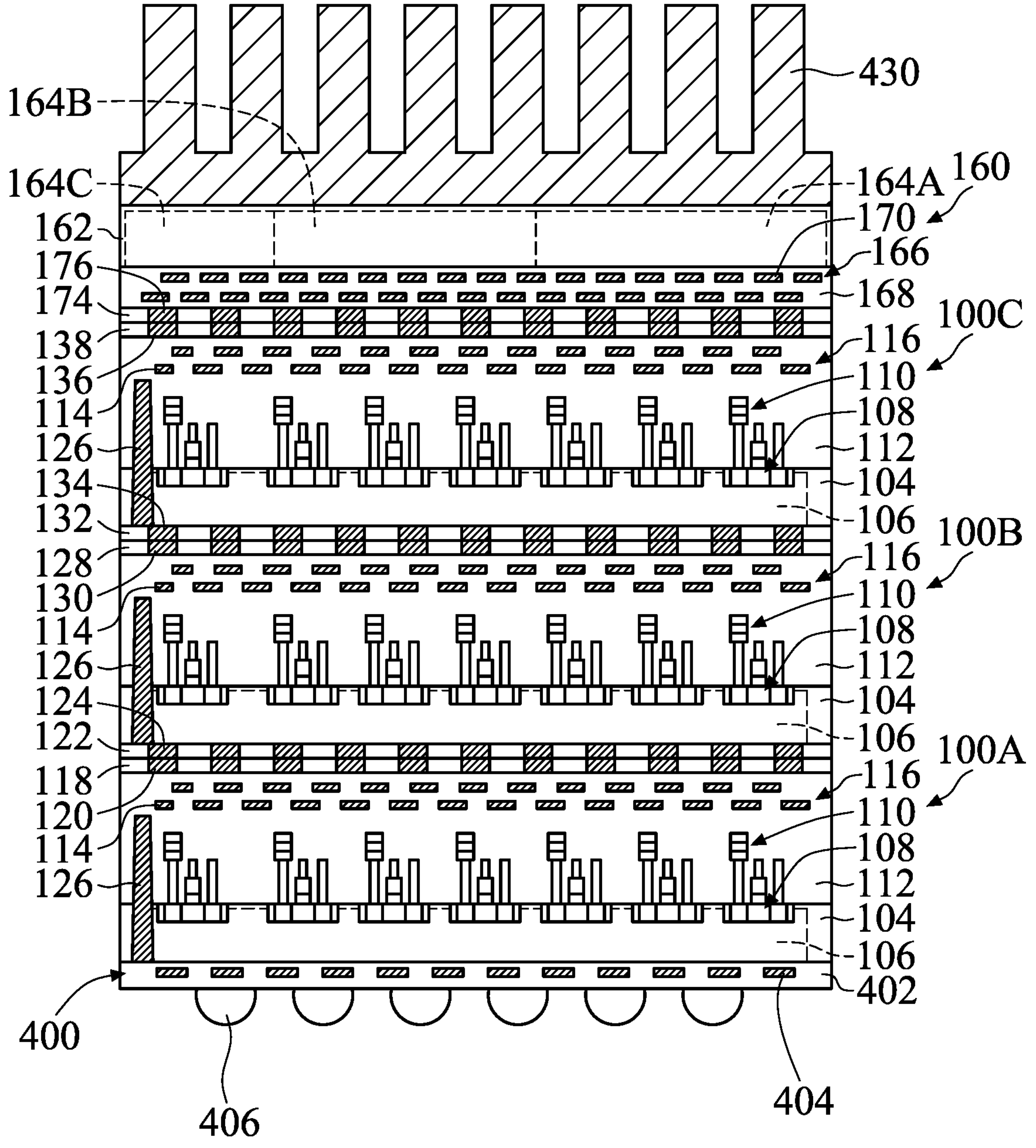

FIGS. 4A-4B are cross-sectional views of various stages of a process for forming a package structure, in accordance with some embodiments. As shown in FIG. 4A, a structure similar to the structure shown in FIG. 1I is formed. In some embodiments, unlike the embodiments shown in FIG. 1I, no redistribution structure is formed on the backside of the chip structure 160. The backside of the chip structure 160 is exposed, as shown in FIG. 4A.

In some embodiments, the chip structure 160 does not have a through substrate via. In some embodiments, similar to the chip structures 100B and 100C, the chip structure 100A also includes one or more through substrate vias 126. In some embodiments, the through substrate vias 126 of the chip structures 100A-100C vertically overlap the device region 164C of the chip structure 160. In some embodiments, the chip structures 100A-100C further include other through substrate vias that may be used to provide input and output interconnects and/or power interconnects to the chip structure 160.

In some embodiments, a redistribution structure 400 is formed on the backside of the chip structure 100A, in accordance with some embodiments. The redistribution structure 400 includes multiple insulating layers 402 and multiple conductive features 404. The material and formation method of the redistribution structure 400 may be the same as or similar to those of the redistribution structure 190 illustrated in FIG. 1I. Afterwards, multiple conductive bumps 406 are formed, as shown in FIG. 4A.

As shown in FIG. 4B, a heat sink 430 is disposed over the backside of the chip structure 160, in accordance with some embodiments. The heat sink 430 may be made of or include copper, aluminum, steel, one or more other thermal conductive materials, or a combination thereof. In some embodiments, the chip structure 160 is a logic control chip structure which may generate much thermal energy during operation. The heat sink 430 may help to lead out the thermal energy, so as to ensure that the chip structure 160 can operate at a lower temperature. The performance and reliability of the package structure are improved.

As mentioned above, the chip structure may function as a system on integrated chips (SoIC) that may further be integrated into a chip on wafer on substrate (CoWoS) package structure, an integrated fan-out (InFO) package structure, or the like. In some embodiments, the heat sink 430 is disposed on the chip structure 160 before the package structure is integrated into another package structure such as a CoWoS package structure, an InFO package structure, or the like. In some other embodiments, the heat sink 430 is disposed after the entire or partial of the packaging processes of the CoWoS package structure or the InFO package structure are performed.

Many variations and/or modifications can be made to embodiments of the disclosure. In some embodiments, the chip structure 160 and the chip structures 100A-100C are bonded together using a wafer on wafer (WoW) process. However, embodiments of the disclosure are not limited thereto. In some other embodiments, the chip structures are bonded together using a chip on wafer (CoW) process.

Figure 5A:
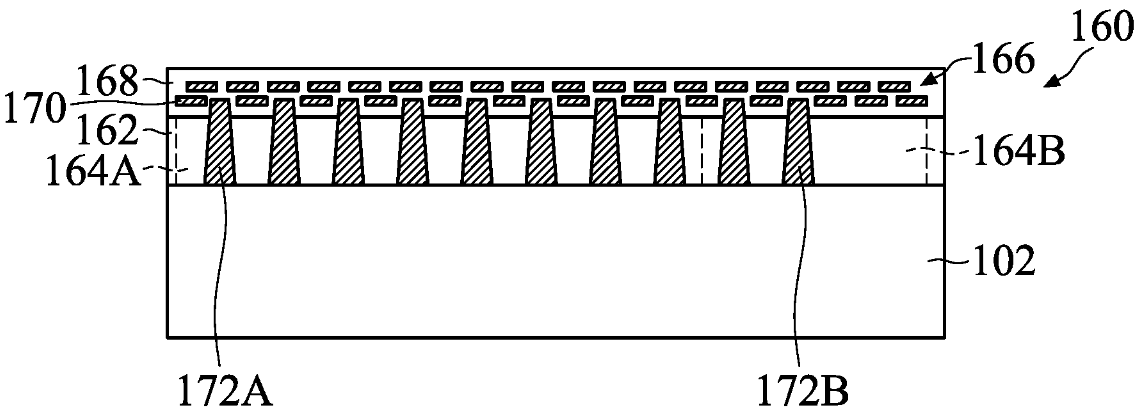
FIGS. 5A-5E are cross-sectional views of various stages of a process for forming a package structure, in accordance with some embodiments.

FIGS. 5A-5E are cross-sectional views of various stages of a process for forming a package structure, in accordance with some embodiments. As shown in FIG. 5A, a chip structure 160, that is the same as or similar to the chip structure 160 shown in FIG. 2F, is disposed over a carrier substrate 102, in accordance with some embodiments.

Figure 5B:
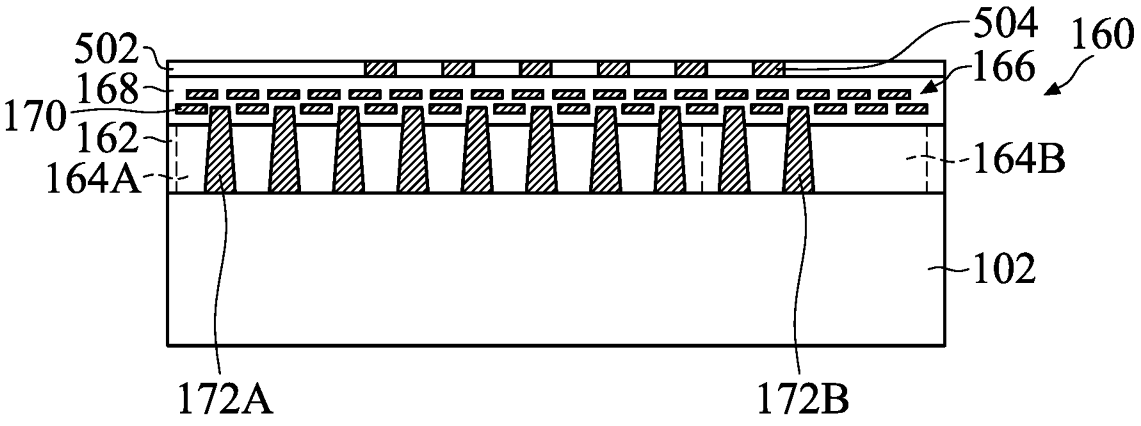

As shown in FIG. 5B, a dielectric layer 502 and multiple conductive features 504 are formed over the front-side interconnection structure 166 of the chip structure 160, in accordance with some embodiments. The material and formation method of the dielectric layer 502 may be the same as or similar to those of the dielectric layer 118. The material and formation method of the conductive features 504 may be the same as or similar to those of the conductive features 120. The dielectric layer 502 and the conductive features 504 may together function as a bonding structure. Similarly, a planarization process may be used to provide a highly planarized bonding surface of the chip structure 160.

Figure 5C:
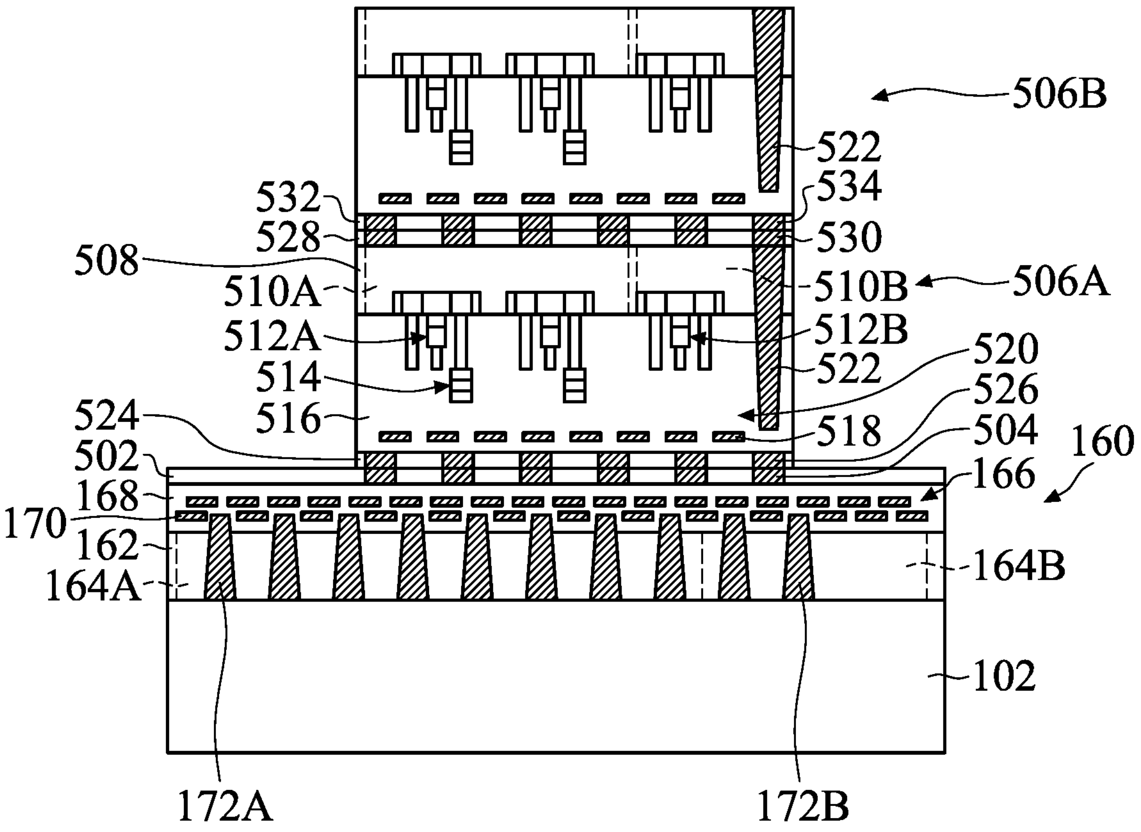

As shown in FIG. 5C, chip structures 506A and 506B are sequentially stacked over the chip structure 160. In some embodiments, the chip structure 160 is wider than each of the chip structures 506A and 506B. As mentioned above, in some embodiments, the chip structure 100B shown in FIG. 2B is a semiconductor wafer. In some embodiments, each of the chip structures 506A and 506B is a known good die that is diced from the chip structure 100B. Similar to the embodiments illustrated in FIGS. 2C-2E, the chip structure 506A is directly bonded to the chip structure 160 through dielectric-to-dielectric bonding and metal-to-metal bonding. The chip structure 506B is also directly bonded to the chip structure 506A through dielectric-to-dielectric bonding and metal-to-metal bonding.

In some embodiments, similar to the embodiments illustrated in FIGS. 2C-2E, multiple dielectric layers 524, 528, and 532 are formed to assist in the bonding between the chip structures, as shown in FIG. 5C. Similarly, multiple conductive features 526, 530, and 534 are also formed. The dielectric layers and conductive features may function as bonding structures to achieve hybrid bonding between the chip structures.

As shown in FIG. 5C, similar to the chip structure 100B shown in FIG. 2B, each of the chip structures 506A and 506B includes a semiconductor substrate 508. In some embodiments, the semiconductor substrate 508 has device regions 510A and 510B. Multiple device elements are formed in and/or on the device regions 510A and 510B. Examples of the various device elements include transistors (e.g., metal oxide semiconductor field effect transistors (MOSFET), complementary metal oxide semiconductor (CMOS) transistors, bipolar junction transistors (BJT), or other suitable elements. Various processes may be used to form the various device elements, including deposition, etching, implantation, photolithography, annealing, and/or other suitable processes.

In some embodiments, a front-side interconnection structure 520 is formed on the semiconductor substrate 508 for providing electrical connections to the device elements. The front-side interconnection structure 520 includes multiple conductive features 518 that are surrounded by multiple dielectric layers 516. The conductive features 518 may include conductive contacts, conductive lines, and conductive vias. The formation of the front-side interconnection structure 520 may involve multiple deposition processes, multiple patterning processes, and multiple planarization processes.

The device elements in the device regions 510A and 510B of the chip structures 506A and 506B may be interconnected by the front-side interconnection structure 520 to form integrated circuit devices. In some embodiments, the device elements at the device regions 510A may form memory cell array elements, word line switch elements, level shifter elements, or the like. In some embodiments, the device elements at the device regions 510B may form analog-to-digital converter (ADC) elements, input and/or output elements, or the like.

In some embodiments, the chip structures 506A and 506B includes multiple transistors 512A and multiple resistive elements 514 at the device region 510A, as shown in FIG. 5C. Each of the chip structures 506A and 506B also include multiple transistors 512B at the device region 510B. The transistors 512A and the resistive elements 514 may together form a memory cell array such as a resistive random access memory (RRAM) cell array.

In some embodiments, multiple through substrate vias 522 are formed in the chip structures 506A and 506B, as shown in FIG. 5C. In some embodiments, each of the through substrate vias 522 extends from the backside of the chip structure 506A or 506B towards the front-side interconnection structure 520. In some embodiments, each of the through substrate vias 522 vertically overlaps the device region 164B of the chip structure 160.

Figure 5D:
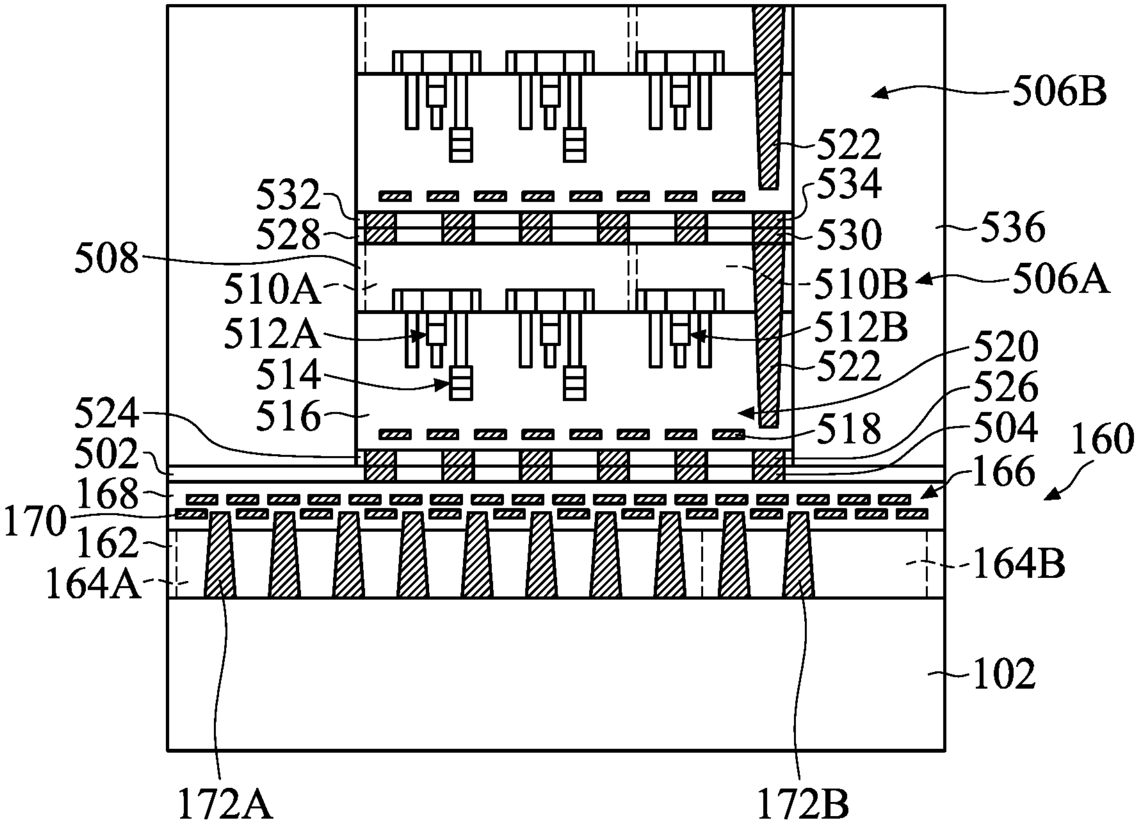

As shown in FIG. 5D, a protective layer 536 is formed over the chip structure 160 to laterally surround the chip structures 506A and 506B, in accordance with some embodiments. The protective layer 536 may be made of or include a molding material. The molding material may include an epoxy-based material dispersed with fillers such as silica fibers. Alternatively, the protective layer 536 may be made of or include silicon oxide or the like.

Figure 5E:
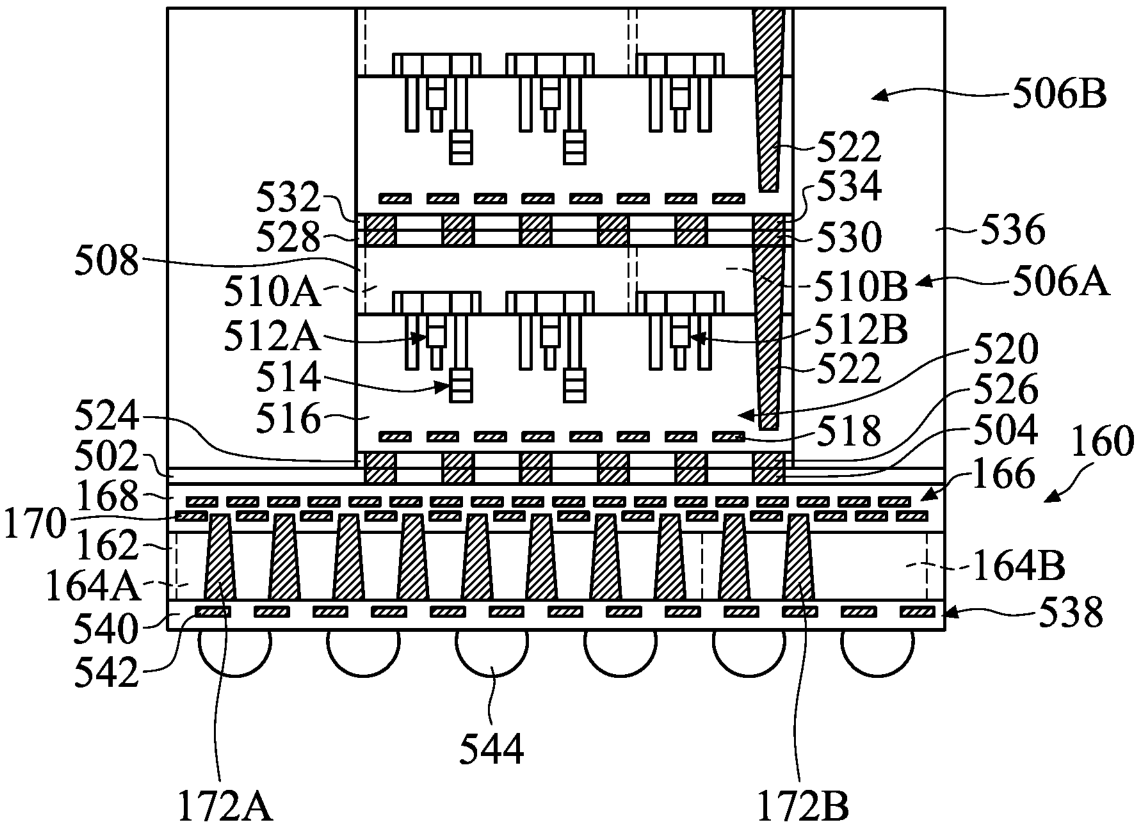

As shown in FIG. 5E, the carrier substrate 102 is removed, and a redistribution structure 538 is formed on the backside of the chip structure 160, in accordance with some embodiments. The redistribution structure 538 includes multiple insulating layers 540 and multiple conductive features 542. The material and formation method of the redistribution structure 538 may be the same as or similar to those of the redistribution structure 190 illustrated in FIG. 1I. Afterwards, multiple conductive bumps 544 are formed, as shown in FIG. 5E.

In some embodiments, one or more dicing operations are used to separate the bonded chip structures into multiple package structures. One of the package structures is shown in FIG. 5E. The package structure may function as a system on integrated chips (SoIC) that may further be integrated into a chip on wafer on substrate (CoWoS) package structure, an integrated fan-out (InFO) package structure, or the like. The package structure may be used as a RRAM accelerator. In some other embodiments, no dicing operation is performed. The entirety of the chip on wafer structure forms a package structure.

Figure 6:
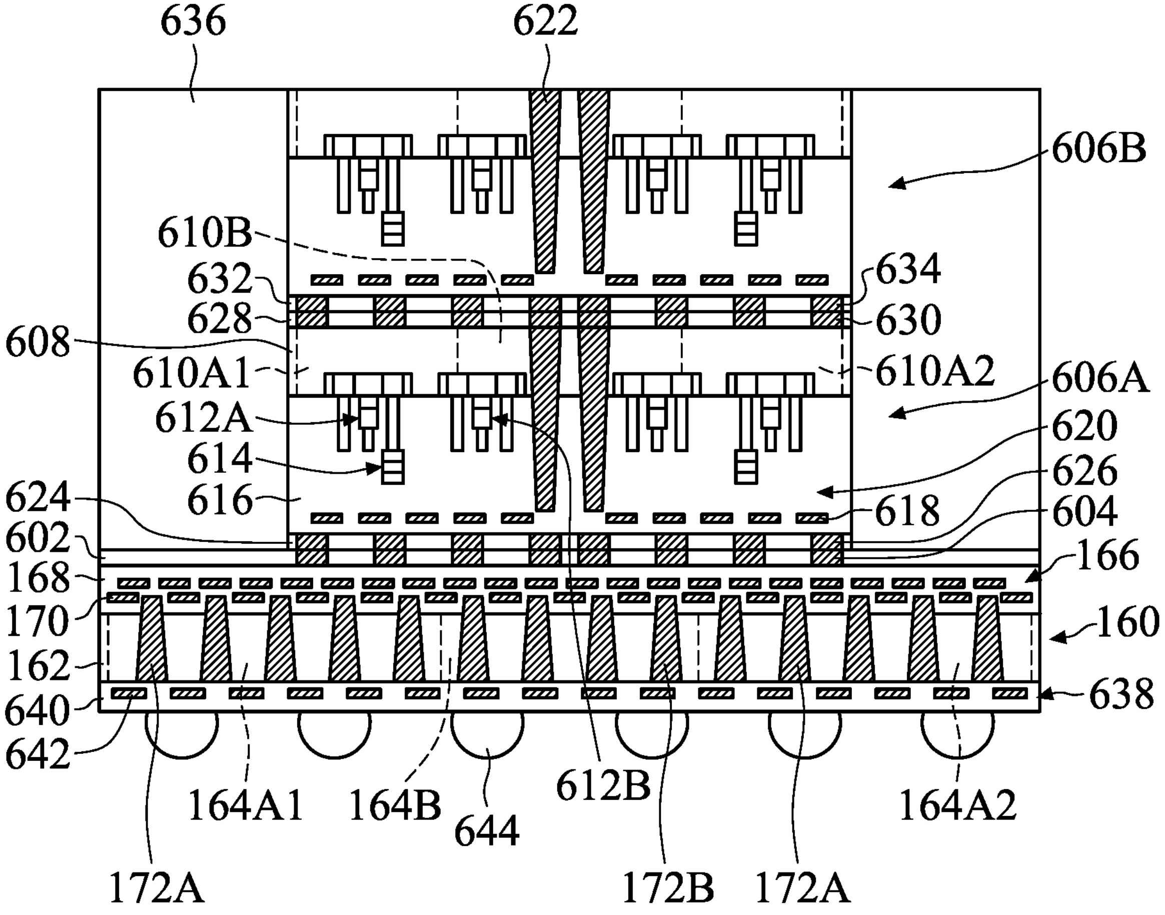
FIG. 6 is a cross-sectional view of an intermediate stage of a process for forming a package structure, in accordance with some embodiments.

Many variations and/or modifications can be made to embodiments of the disclosure. FIG. 6 is a cross-sectional view of an intermediate stage of a process for forming a package structure, in accordance with some embodiments. A structure that is similar to that shown in FIG. 5E is formed.

As shown in FIG. 6, similar to the embodiments illustrated in FIGS. 5A-5E, chip structures 606A and 606B are stacked over the chip structures 160. The bonding between the chip structures 160, 606A, and 606B may be achieved by hybrid bonding that includes dielectric-to-dielectric bonding and metal-to-metal bonding. Similarly, multiple dielectric layers 602, 624, 628, and 632 are formed, and multiple conductive features 604, 626, 630, and 634 are formed. These dielectric layers and conductive features may function as bonding structures.

As shown in FIG. 6, similar to the embodiments shown in FIG. 5A, the chip structure 160 has device regions 164A1, 164A2, and 164B. In some embodiments, the device regions 164A1 and 164A2 are the same as or similar to the device region 164A. In some embodiments, the device region 164B is formed between the device regions 164A1 and 164A2.

As shown in FIG. 6, each of the chip structures 606A and 606B includes a semiconductor substrate 608. In some embodiments, the semiconductor substrate 608 has device regions 610A1, 610A2, and 610B. Multiple device elements are formed in and/or on the device regions 610A1, 610A2, and 610B. Examples of the various device elements include transistors (e.g., metal oxide semiconductor field effect transistors (MOSFET), complementary metal oxide semiconductor (CMOS) transistors, bipolar junction transistors (BJT), or other suitable elements.

In some embodiments, a front-side interconnection structure 620 is formed on the semiconductor substrate 608 for providing electrical connections to the device elements. The front-side interconnection structure 620 includes multiple conductive features 618 that are surrounded by multiple dielectric layers 616. The conductive features 618 may include conductive contacts, conductive lines, and conductive vias. The formation of the front-side interconnection structure 620 may involve multiple deposition processes, multiple patterning processes, and multiple planarization processes.

The device elements in the device regions 610A1, 610A2, and 610B of the chip structures 606A and 606B may be interconnected by the front-side interconnection structure 620 to form integrated circuit devices. In some embodiments, the device elements at the device regions 610A1 and 610A2 may form memory cell array elements, word line switch elements, level shifter elements, or the like. In some embodiments, the device elements at the device regions 610B may form analog-to-digital converter (ADC) elements, input and/or output elements, or the like.

In some embodiments, the chip structures 606A and 606B includes multiple transistors 612A and multiple resistive elements 614 at the device regions 610A1 and 610A2, as shown in FIG. 6. Each of the chip structures 606A and 606B also include multiple transistors 612B at the device region 610B. The transistors 612A and the resistive elements 614 may together form a memory cell array such as a resistive random access memory (RRAM) cell array.

In some embodiments, multiple through substrate vias 622 are formed in the chip structures 606A and 606B, as shown in FIG. 6. In some embodiments, each of the through substrate vias 622 extends from the backside of the chip structure 606A or 606B towards the front-side interconnection structure 620. In some embodiments, each of the through substrate vias 622 vertically overlaps the device region 164B of the chip structure 160.

As shown in FIG. 6, a protective layer 636 is formed over the chip structure 160 to laterally surround the chip structures 606A and 606B, in accordance with some embodiments. As shown in FIG. 6, a redistribution structure 638 is formed on the backside of the chip structure 160, in accordance with some embodiments. The redistribution structure 638 includes multiple insulating layers 640 and multiple conductive features 642. The material and formation method of the redistribution structure 638 may be the same as or similar to those of the redistribution structure 190 illustrated in FIG. 1I. Multiple conductive bumps 644 are formed on the redistribution structure 638, as shown in FIG. 6.

In some embodiments, the package structure shown in FIG. 6 functions as a system on integrated chips (SoIC) that may further be integrated into a chip on wafer on substrate (CoWoS) package structure, an integrated fan-out (InFO) package structure, or the like. The package structure may be used as a RRAM accelerator.

Many variations and/or modifications can be made to embodiments of the disclosure. In the embodiments illustrated in FIG. 5E, the redistribution structure 538 is formed on the backside of the chip structure 160. However, embodiments of the disclosure are not limited thereto. In some other embodiments, the redistribution structure is formed on the backside of the chip structure 506B.

Figure 7A:
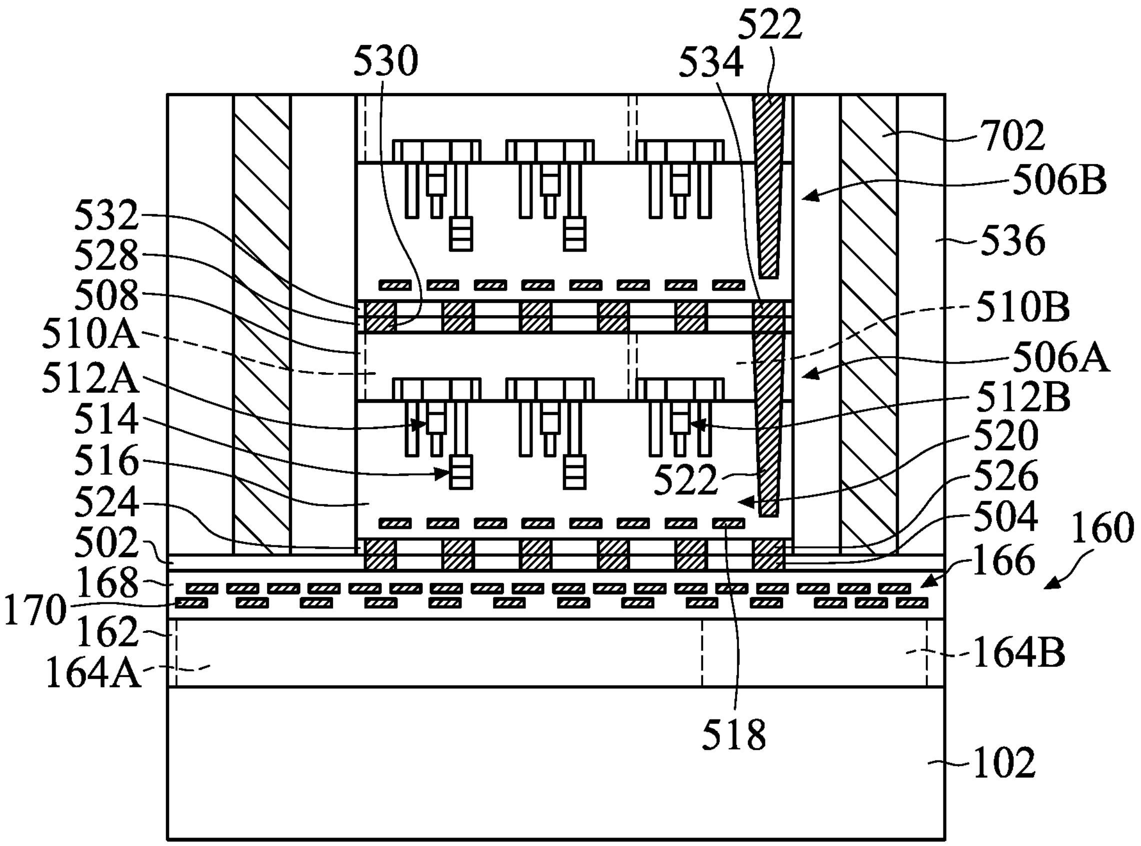
FIGS. 7A-7D are cross-sectional views of various stages of a process for forming a package structure, in accordance with some embodiments.

FIGS. 7A-7D are cross-sectional views of various stages of a process for forming a package structure, in accordance with some embodiments. As shown in FIG. 7A, a structure similar to the structure shown in FIG. 5D is formed.

In some embodiments, the chip structure 160 does not have a through substrate via. In some embodiments, multiple conductive structures 702 are formed in the protective layer 536. Each of the conductive structures 702 may penetrate through the protective layer 536 and be electrically connected to one or more of the conductive features 170. The conductive structures 702 may be used to provide input and output interconnects and/or power interconnects to the chip structure 160.

Figure 7B:
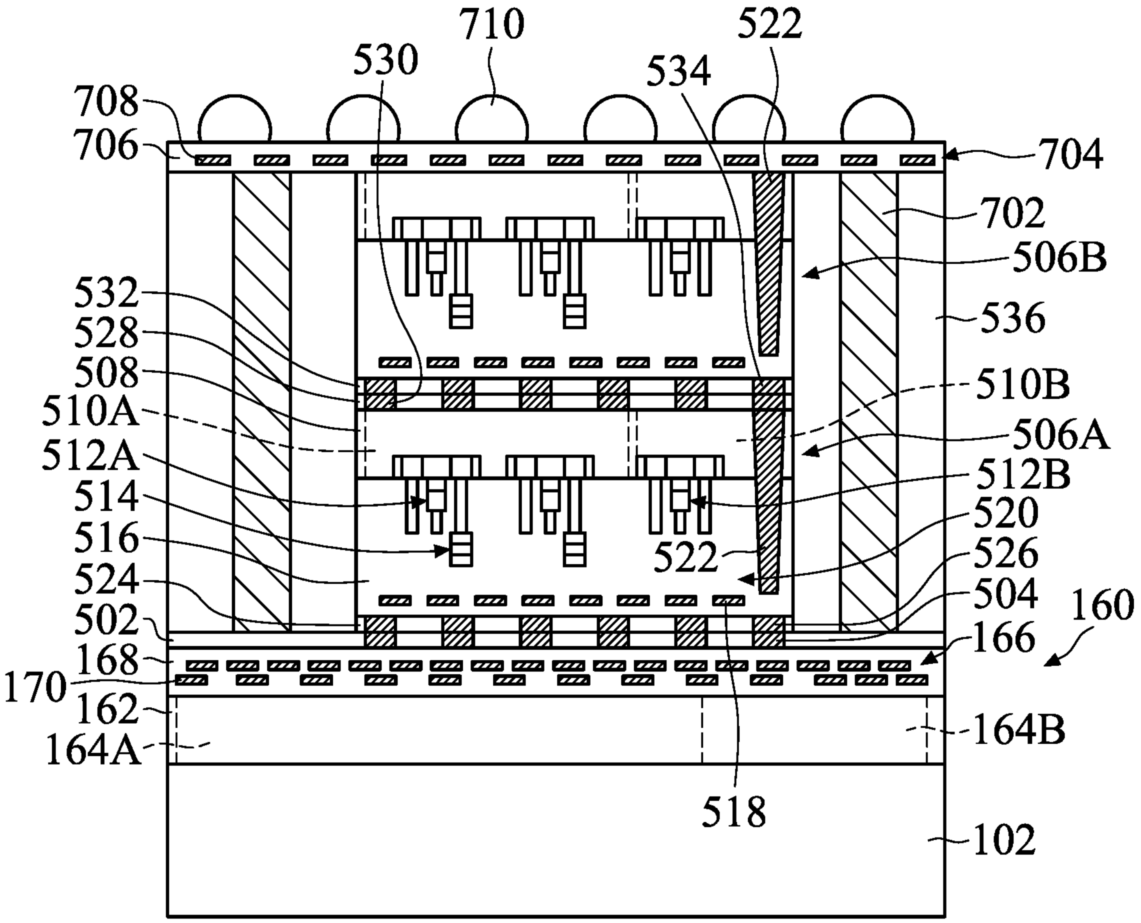

As shown in FIG. 7B, a redistribution structure 704 is formed on the protective layer 536, the conductive structures 702, and the backside of the chip structure 506B, in accordance with some embodiments. The redistribution structure 704 includes multiple insulating layers 706 and multiple conductive features 708. The material and formation method of the redistribution structure 704 may be the same as or similar to those of the redistribution structure 190 illustrated in FIG. 1I. Afterwards, multiple conductive bumps 710 are formed on the redistribution structure 704, as shown in FIG. 7B.

Figure 7C:
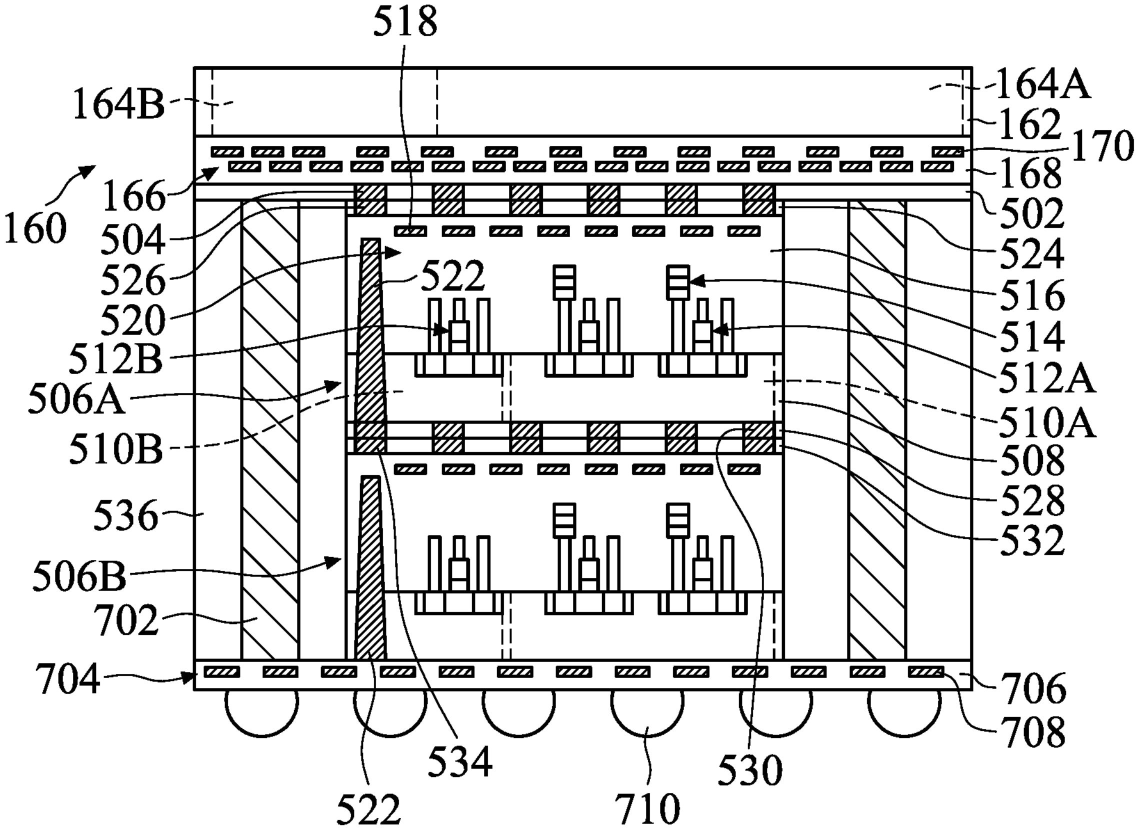

As shown in FIG. 7C, the structure shown in FIG. 7B is turned upside down, and the carrier substrate 102 is removed, in accordance with some embodiments. A carrier tape may be used to carry the structure shown in FIG. 7C. After the removal of the carrier substrate 102, the backside of the chip structure 160 is exposed, as shown in FIG. 7C.

Figure 7D:
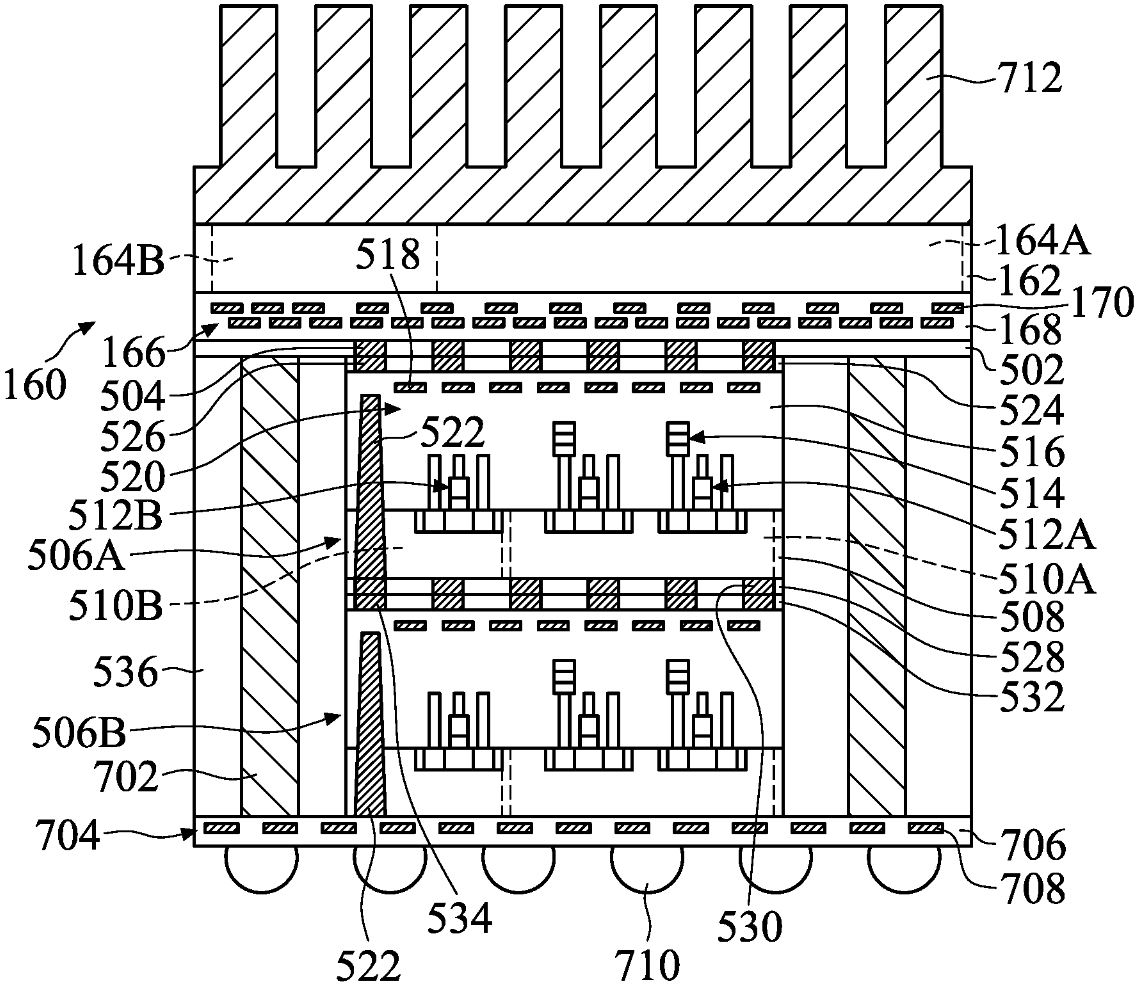

As shown in FIG. 7D, a heat sink 712 is disposed over the backside of the chip structure 160, in accordance with some embodiments. The heat sink 712 may be made of or include copper, aluminum, steel, one or more other thermal conductive materials, or a combination thereof. In some embodiments, the chip structure 160 is a logic control chip structure which may generate much thermal energy during operation. The heat sink 712 may help to lead out the thermal energy, so as to ensure that the chip structure 160 can operate at a lower temperature. The performance and reliability of the package structure are improved.

As mentioned above, the chip structure may function as a system on integrated chips (SoIC) that may further be integrated into a chip on wafer on substrate (CoWoS) package structure, an integrated fan-out (InFO) package structure, or the like. In some embodiments, the heat sink 712 is disposed on the chip structure 160 before the package structure is integrated into another package structure such as a CoWoS package structure, an InFO package structure, or the like. In some other embodiments, the heat sink 712 is disposed after the entire or partial of the packaging processes of the CoWoS package structure or the InFO package structure are performed.

Many variations and/or modifications can be made to embodiments of the disclosure. In the embodiments illustrated in FIG. 6, the redistribution structure 638 is formed on the backside of the chip structure 160. However, embodiments of the disclosure are not limited thereto. In some other embodiments, the redistribution structure is formed on the backside of the chip structure 606B.

Figure 8:
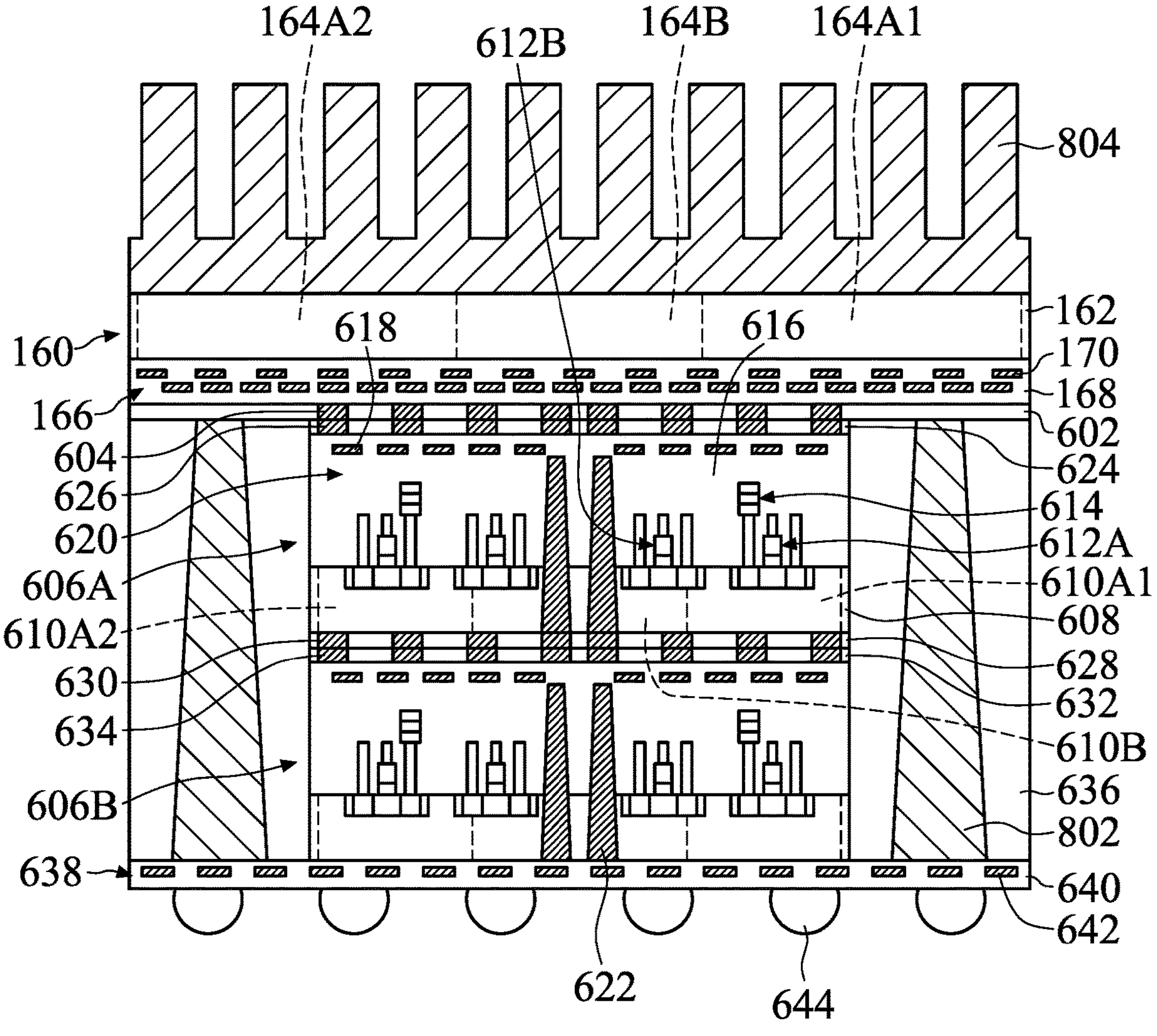
FIG. 8 is a cross-sectional view of an intermediate stage of a process for forming a package structure, in accordance with some embodiments.

FIG. 8 is a cross-sectional view an intermediate stage of a process for forming a package structure, in accordance with some embodiments. As shown in FIG. 8, a structure similar to the structure shown in FIG. 6 is formed. The processes steps that are similar to those shown in FIGS. 7A-7D may be used to form the structure shown in FIG. 8.

In some embodiments, the chip structure 160 does not have a through substrate via. In some embodiments, multiple conductive structures 802 are formed in the protective layer 636. Each of the conductive structures 802 may penetrate through the protective layer 636 and be electrically connected to one or more of the conductive features 170. The conductive structures 802 may be used to provide input and output interconnects and/or power interconnects to the chip structure 160.

As shown in FIG. 8, unlike the embodiments shown in FIG. 6, the redistribution structure 638 is formed on the protective layer 636, the conductive structures 802, and the backside of the chip structure 606B, in accordance with some embodiments.

As shown in FIG. 8, a heat sink 804 is disposed over the backside of the chip structure 160, in accordance with some embodiments. In some embodiments, the chip structure 160 is a logic control chip structure which may generate much thermal energy during operation. The heat sink 804 may help to lead out the thermal energy, so as to ensure that the chip structure 160 can operate at a lower temperature. The performance and reliability of the package structure are improved.

Embodiments of the disclosure form a package structure that includes a stack of multiple chip structures. One or more memory cell array chip structures are bonded to a logic control chip structure through dielectric-to-dielectric bonding and metal-to-metal bonding. The package structure may function as a RRAM accelerator or the like. The performance and reliability of the package structure with the three-dimensional architecture may be greatly improved.

In accordance with some embodiments, a package structure is provided. The package structure includes a first chip structure, and the first chip structure has multiple logic control elements. The package structure also includes a second chip structure directly bonded to the first chip structure through dielectric-to-dielectric bonding and metal-to-metal bonding. The second chip structure has multiple non-volatile memory elements.

In accordance with some embodiments, a package structure is provided. The package structure includes a logic control chip structure, and the logic control chip structure has multiple first transistors with a first average gate width. The package structure also includes a memory array cube directly bonded to the logic control chip structure through dielectric-to-dielectric bonding and metal-to-metal bonding. The memory array cube has multiple second transistors with a second average gate width. The second average gate width is wider than the first average gate width.

In accordance with some embodiments, a method for forming a package structure is provided. The method includes bonding a first memory-containing chip structure to a second memory-containing chip structure through dielectric-to-dielectric bonding and metal-to-metal bonding. The method also includes bonding a logic control chip structure to the second memory-containing chip structure through dielectric-to-dielectric bonding and metal-to-metal bonding. The logic control chip structure is formed using a more advanced technology node than the second memory-containing chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a first chip structure, wherein the first chip structure has a plurality of logic control elements;

a second chip structure directly bonded to the first chip structure through dielectric-to-dielectric bonding and metal-to-metal bonding, wherein the second chip structure has a plurality of non-volatile memory elements; and a protective layer formed over the first chip structure and laterally surrounding the second chip structure, wherein the first chip structure is wider than the second chip structure.

2. The package structure as claimed in claim 1, further comprising:

a third chip structure directly bonded to the second chip structure through dielectric-to-dielectric bonding and metal-to-metal bonding, wherein the second chip structure is between the third chip structure and the first chip structure, and the third chip structure has a plurality of second non-volatile memory elements.

3. The package structure as claimed in claim 2, further comprising:

a through substrate via formed in the second chip structure.

4. The package structure as claimed in claim 3, wherein the first chip structure has a first region with cache elements, a second region with accumulator elements, and a third region with analog-to-digital converter elements, and the through substrate via vertically overlaps the third region of the first chip structure.

5. The package structure as claimed in claim 3, wherein the first chip structure has a first region with cache elements and a second region with accumulator elements, the second chip structure has a region with analog-to-digital converter elements, the through substrate via is electrically connected to one of the analog-to-digital converter elements, and the through substrate via vertically overlaps the second region of the first chip structure.

6. The package structure as claimed in claim 1, further comprising:

a redistribution structure formed on the first chip structure, wherein the first chip structure is between the redistribution structure and the second chip structure; and a plurality of through substrate vias formed in the first chip structure.

7. The package structure as claimed in claim 1, further comprising:

a redistribution structure formed on the second chip structure, wherein the second chip structure is between the redistribution structure and the first chip structure; and a plurality of through substrate vias formed in the second chip structure.

8. The package structure as claimed in claim 1, further comprising:

a redistribution structure formed over the protective layer and the second chip structure, wherein the second chip structure is between the redistribution structure and the first chip structure; and a conductive structure penetrating through the protective layer and formed between the first chip structure and the redistribution structure.

9. The package structure as claimed in claim 1, further comprising:

a heat sink formed on the first chip structure, and the first chip structure is between the heat sink and the second chip structure.

10. A package structure, comprising:

a logic control chip structure, wherein the logic control chip structure has a plurality of first transistors with a first average gate width; and a memory array cube directly bonded to the logic control chip structure through dielectric-to-dielectric bonding and metal-to-metal bonding, wherein the memory array cube has a plurality of second transistors with a second average gate width, and the second average gate width is wider than the first average gate width.

11. The package structure as claimed in claim 10, wherein the memory array cube comprises a plurality of memory chips bonded together through dielectric-to-dielectric bonding and metal-to-metal bonding.

12. The package structure as claimed in claim 11, further comprising:

a plurality of through substrate vias formed in the memory array cube.

13. The package structure as claimed in claim 12, wherein a topmost memory chip of the memory array cube does not have the through substrate vias.

14. The package structure as claimed in claim 10, wherein the logic control chip structure is wider than the memory array cube.

15. A package structure, comprising:

a logic control chip structure, wherein the logic control chip structure has a plurality of first transistors with a first average gate width; and a memory chip structure directly bonded to the logic control chip structure through dielectric-to-dielectric bonding and metal-to-metal bonding, wherein the memory chip structure has a plurality of second transistors with a second average gate width, and the second average gate width is wider than the first average gate width.

16. The package as claimed in claim 15, further comprising:

a through substrate via formed in the memory chip structure.

17. The package structure as claimed in claim 16, wherein the logic control chip structure has a first region with cache elements and a second region with accumulator elements, the memory chip structure has a region with analog-to-digital converter elements, the through substrate via is electrically connected to one of the analog-to-digital converter elements, and the through substrate via is vertically aligned with a part of the second region of the logic control chip structure.

18. The package as claimed in claim 15, further comprising:

a protective layer formed over the logic control chip structure and laterally surrounding the memory chip structure, wherein the logic control chip structure is wider than the memory chip structure.

19. The package structure as claimed in claim 18, further comprising:

a redistribution structure formed over the protective layer and the memory chip structure, wherein the memory chip structure is between the redistribution structure and the logic control chip structure; and a conductive structure surrounded by the protective layer and formed between the logic control chip structure and the redistribution structure, wherein the conductive structure is longer than the memory chip structure.

20. The package structure as claimed in claim 1, wherein the logic control elements have a plurality of first transistors with a first average gate width, the non-volatile memory elements have a plurality of second transistors with a second average gate width, and the first average gate width is different from the second average gate width.

* * * * *